(12) United States Patent
Rohe et al.

(10) Patent No.: US 7,236,009 B1
(45) Date of Patent: Jun. 26, 2007

(54) OPERATIONAL TIME EXTENSION

(76) Inventors: Andre Rohe, 3927 Louis Rd., Palo Alto, CA (US) 94303; Steven Teig, 935 College Ave., Menlo Park, CA (US) 94025; Herman Schmit, 2919 Simkins Ct., Palo Alto, CA (US) 94303; Jason Redgrave, 278 Martens Ave., Mountain View, CA (US) 94040; Andrew Caldwell, 4217 Rivermark Pkwy., Santa Clara, CA (US) 95054

( * ) Notice: Subject to any disclaimer, the term of this patent is extended or adjusted under 35 U.S.C. 154(b) by 182 days.

(21) Appl. No.: 11/082,200

(22) Filed: Mar. 15, 2005

Related U.S. Application Data

(60) Provisional application No. 60/632,277, filed on Dec. 1, 2004.

(51) Int. Cl.
*H03K 19/173* (2006.01)
*H03K 19/177* (2006.01)
*G06F 7/38* (2006.01)
*H01L 25/00* (2006.01)

(52) U.S. Cl. .......................... 326/41; 326/37; 326/38; 326/39; 326/40; 326/47; 716/16

(58) Field of Classification Search ............ 326/37–41, 326/47
See application file for complete search history.

(56) References Cited

U.S. PATENT DOCUMENTS

| | | | |
|---|---|---|---|
| 4,873,459 A | 10/1989 | El Gamal et al. | |
| 5,349,250 A | 9/1994 | New | |
| 5,357,153 A | 10/1994 | Chiang et al. | |
| 5,365,125 A | 11/1994 | Goetting et al. | |
| 5,521,835 A | 5/1996 | Trimberger | |
| 5,552,721 A | 9/1996 | Gould | |
| 5,610,829 A | 3/1997 | Trimberger | |
| 5,631,578 A * | 5/1997 | Clinton et al. | 326/41 |
| 5,646,544 A | 7/1997 | Iadanza | |
| 5,659,484 A | 8/1997 | Bennett et al. | |
| 5,692,147 A | 11/1997 | Larsen et al. | |
| 5,694,057 A | 12/1997 | Gould | |
| 5,719,889 A | 2/1998 | Iadanza | |
| 5,732,246 A | 3/1998 | Gould et al. | |
| 5,737,235 A | 4/1998 | Kean et al. | |
| 5,745,422 A | 4/1998 | Iadanza | |
| 5,745,734 A | 4/1998 | Craft et al. | |
| 5,764,954 A | 6/1998 | Fuller et al. | |
| 5,777,360 A | 7/1998 | Rostoker et al. | |
| 5,802,003 A | 9/1998 | Iadanza et al. | |
| 5,815,726 A | 9/1998 | Cliff | |
| 5,889,411 A | 3/1999 | Chaudhary | |
| 5,914,616 A | 6/1999 | Young et al. | |
| 5,914,906 A | 6/1999 | Iadanza et al. | |

(Continued)

OTHER PUBLICATIONS

U.S. Appl. No. 11/081,823, filed Mar. 15, 2005, Rohe.

(Continued)

*Primary Examiner*—Rexford Barnie
*Assistant Examiner*—Dylan White
(74) *Attorney, Agent, or Firm*—Adeli Law Group

(57) ABSTRACT

Some embodiments provide a reconfigurable integrated circuit ("IC"). This IC has several reconfigurable circuits, each having several configurations for several configuration cycles. The reconfigurable circuits include several time-extending reconfigurable circuits. During the operation of the IC, each particular time-extending reconfigurable circuit maintains at least one of its configurations over at least two contiguous cycles, in order to allow a signal to propagate through a signal path, which contains the particular time-extending circuit, within a desired amount of time.

18 Claims, 24 Drawing Sheets

U.S. PATENT DOCUMENTS

| | | | |
|---|---|---|---|
| 6,023,421 | A | 2/2000 | Clinton et al. |
| 6,038,192 | A | 3/2000 | Clinton et al. |
| 6,044,031 | A | 3/2000 | Iadanza et al. |
| 6,054,873 | A | 4/2000 | Laramie |
| 6,069,490 | A | 5/2000 | Ochotta et al. |
| 6,075,745 | A | 6/2000 | Gould et al. |
| 6,086,631 | A | 7/2000 | Chaudhary et al. |
| 6,091,263 | A | 7/2000 | New et al. |
| 6,091,645 | A | 7/2000 | Iadanza |
| 6,108,805 | A * | 8/2000 | Rajsuman ................. 714/724 |
| 6,110,223 | A | 8/2000 | Southgate et al. |
| 6,118,707 | A | 9/2000 | Gould et al. |
| 6,130,854 | A | 10/2000 | Gould et al. |
| 6,140,839 | A | 10/2000 | Kaviani et al. |
| 6,150,838 | A | 11/2000 | Wittig et al. |
| 6,175,247 | B1 | 1/2001 | Scalera et al. |
| 6,184,707 | B1 | 2/2001 | Norman et al. |
| 6,233,191 | B1 | 5/2001 | Gould et al. |
| 6,381,732 | B1 | 4/2002 | Burnham et al. |
| 6,487,709 | B1 * | 11/2002 | Keller et al. ................. 716/14 |
| 6,490,707 | B1 | 12/2002 | Baxter |
| 6,515,509 | B1 | 2/2003 | Baxter |
| 6,529,040 | B1 | 3/2003 | Carberry et al. |
| 6,545,501 | B1 | 4/2003 | Bailis et al. |
| 6,593,771 | B2 | 7/2003 | Bailis et al. |
| 6,601,227 | B1 | 7/2003 | Trimberger |
| 6,603,330 | B1 | 8/2003 | Snyder |
| 6,629,308 | B1 | 9/2003 | Baxter |
| 6,636,070 | B1 | 10/2003 | Altaf |
| 6,642,763 | B2 * | 11/2003 | Dike ......................... 327/202 |
| 6,667,635 | B1 | 12/2003 | Pi et al. |
| 6,668,361 | B2 | 12/2003 | Bailis et al. |
| 6,675,309 | B1 | 1/2004 | Baxter |
| 6,714,041 | B1 | 3/2004 | Darling et al. |
| 6,806,730 | B2 | 10/2004 | Bailis et al. |
| 6,831,479 | B2 | 12/2004 | Lo |
| 6,851,101 | B1 | 2/2005 | Kong et al. |
| 2002/0008541 | A1 | 1/2002 | Young et al. |
| 2002/0113619 | A1 * | 8/2002 | Wong ......................... 326/41 |
| 2002/0125910 | A1 | 9/2002 | New et al. |
| 2002/0125914 | A1 | 9/2002 | Kim |
| 2002/0163357 | A1 | 11/2002 | Ting |
| 2003/0042931 | A1 | 3/2003 | Ting |
| 2003/0080777 | A1 | 5/2003 | Baxter |
| 2003/0110430 | A1 | 6/2003 | Bailis et al. |
| 2004/0075481 | A1 * | 4/2004 | Reuveni et al. ............. 327/271 |
| 2004/0196066 | A1 | 10/2004 | Ting |
| 2005/0134308 | A1 * | 6/2005 | Okada et al. ................ 326/39 |
| 2006/0220716 | A1 * | 10/2006 | Nicolaidis ................... 327/199 |

OTHER PUBLICATIONS

U.S. Appl. No. 11/081,854, filed Mar. 15, 2005, Rohe.

"Design for Low Power in Actel Antifuse FPGAs", Actel Application Note, 2000 Actel Corporation, Sep. 2000, pp. 1-8.

"The Xilinx Virtex Series FPGA," Jan. 22, 2001, slides 1-22.

Alpert, C.J., et al., "Quadratic Placement Revisited," Design Automation Conference, '97, Jun. 1997, ACM.

Altera Corp., "6. DSP Blocks in Stratix II Devices," SII52006-1.0, Feb. 2004, pp. 1-32.

Altera, "Stratix II DSP Performance," White Paper, Feb. 2004, pp. 1-9, ver. 1.0, Altera Corporation, San Jose, CA.

Caspi, E., et al., "A Streaming Multi-Threaded Model," MSP-3, Dec. 2, 2001, pp. 1-23.

Caspi, E., et al., "Stream Computations Organized for Reconfigurable Executiion (SCORE): Introduction and Tutorial," Aug. 25, 2000, pp. 1-31, Version 1.0.

Ciemat, J.V., et al., "Annealing Placement by Thermodynamic Combinatorial Optimization," *ACM Transactions on Design Automation of Electronic Systems*, Jul. 2004, pp. 310-332, vol. 9, No. 3, ACM, New York, NY.

Compton, K., et al., "Reconfigurable Computing: A Survey of Systems and Software," *ACM Computing Surveys*, Jun. 2002, pp. 171-210, vol. 34, No. 2, ACM, New York, NY.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Cong, J., et al., "Large-Scale Circuit Placement," ACM Transactions on Design Automation of Electronic Systems, Apr. 2005, pp. 389-430, vol. 10, No. 2, ACM Inc., Broadway, New York, NY.

Davare, A., et al., "The Best of Both Worlds: The Efficient Asynchronous Implementation of Synchronous Specifications," *DAC '04*, Jun. 7-11, 2004, ACM, San Diego, California, USA.

Dehon, A., Balancing Interconnect and Computation in a Reconfigurable Computing Array (or, why don't you really want 100% LUT utilization). pp. 1-10. (Applicants believe that this article also appears in *Proceedings of the International Symposium on Field Programmable Gate Arrays*, Feb. 1999, pp. 125-134.).

Dehon, A., "Dynamically Programmable Gate Arrays: A Step Toward Increased Computational Density," *Proceedings of the Fourth Canadian Workshop on Field-Programmable Devices*, May 1996, pp. 47-54.

Dehon, A., "Reconfigurable Architectures for General-Purpose Computing," *A.I. Technical Report No. 1586*, Oct. 1996, pp. i-353.

Dehon, A., "The Density Advantage of Configurable Computing," Apr. 2000, pp. 41-49, IEEE.

Dehon, A., "Transit Note #121: Notes on Programmable Interconnect," *M.I.T. Transit Project*, Feb. 1995, pp. 1-13.

Dehon, A., et al., "Design Patterns for Reconfigurable Computing," *Proceedings of the IEEE Symposium on Field-Programmable Custom Computing Machines*, Apr. 2004.

Dehon, A., et al., "DPGA-Coupled Microprocessors: Commodity ICs for the Early 21$^{st}$ Century," *FCCM '94-IEEE Workshop on FPGAs for Custom Computing Machines*, Apr. 10-13, 1994.

Gayasen, A., et al., "Reducing Leakage Energy in FPGAs Using Region-Constrained Placement," *FPGA '04*, Feb. 22-24, 2004, pp. 51-58, ACM, Monterey, California, USA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley*, Fall 2000, pp. 1-190, no month.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319, USA.

IBM, "SPU Application Binary Interface Specification, Version 1.3," *CBEA JSRE Series*, Aug. 1, 2005, pp. iv-26, USA.

IBM, "SPU Assembly Language Specification, Version 1.2," *CBEA JSRE Series*, Aug. 1, 2005, pp. iii-22, USA.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

Lemieux, G., et al., "Using Sparse Crossbars within LUT Clusters," *FPGA 2001*, Feb. 11-13, 2001, ACM, Monterey, CA.

Lin, J.Y., et al., "Placement-Driven Technology Mapping for LUT-Based FPGAs," *FPGA '03*, Feb. 23-25, 2003, pp. 121-126, ACM, Monterey, California, USA.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.

Parhami, B., "Part IV: Low-Diameter Architectures," *ECE 254B: Advanced Computer Architecture: Parallel Processing, UCSB*, Spring 2005, slides 1-93, Behrooz Parhami, Santa Barbara, CA, no month.

Perissakis, S., et al., "Embedded DRAM for a Reconfigurable Array," *Proceedings of the 1999 Symposium on VLSI Circuits*, Jun. 1999.

Plunkett, B., "In Search of the SDR Holy Grail," *A Technology Application Whitepaper*, Apr. 28, 2004 but © 2003, pp. 1-7, QuickSilver Technology, Inc., San Jose, California.

QuickSilver Technology, Inc., "Adapt2000 ACM System Platform," Apr. 2004, pp. 1-39, QuickSilver Technology, Inc., San Jose, California.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Sambhwani, S., et al., "Implementing W-CDMA Tranceiver Structure on an Adaptive Computing Platform," *A Technology Application Whitepaper*, Apr. 28, 2004 but © 2003, pp. 1-12, QuickSilver Technology, Inc., San Jose, California.

Schmit, H., et al., "FPGA Switch Block Layout and Evaluation," *FPGA '02*, Feb. 24-26, 2002, ACM, Monterey, California, USA.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Snider, G., "Performance-Constrained Pipelining of Software Loops onto Reconfigurable Hardware," *FPGA '02*, Feb. 24-26, 2002, pp. 177-186, ACM, Monterey, California, USA.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Tom, M., et al., "Logic Block Clustering of Large Designs for Channel-Width Constrained FPGAs," *DAC 2005*, Jun. 13-17, 2005, pp. 726-731, ACM, Anaheim, California, USA.

Tsu, W., et al., "HSRA: High-Speed, Hierarchical Synchronous Reconfigurable Array," pp. 1-10. (Applicants believe that this also appears in *Proceedings of the International Symposium on Field Programmable Gate Arrays*, Feb. 1999, pp. 69-78.).

Wawrzynek, J., "EECS150-Digital Design: Lecture 5—Field Programmable Gate Arrays (FPGAs)," Feb. 4, 2002, pp. 1-4, slides 1-20, multiple slides per page.

Weaver, N., et al., "The SFRA: A Corner-Turn FPGA Architecture," *FPGA '04*, Feb. 22-24, 2004, ACM, Monterey, California, USA.

Xilinx, Inc., "Virtex-4 Family Overview," *Advance Product Specification*, Sep. 10, 2004, pp. 21-30, v1.1, Xilinx, Inc.

"§3 Programmable Logic Devices," *Digital System Design*, 2001 Month N/A, pp. 3.1-3.28.

"The Effect of SRAM Table Sharing and Cluster Size on FPGA Area", NPL Date Unknown, pp. 1-10.

"Unifying Sequential and Spatial Computing with a Single Instruction Set Architecture," *ISCA '04*, Jun. 19-23, 2004, ACM, Munchen, Oberbayern, Germany.

Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, California, USA.

Ahmed, E., et al., "The Effect of LUT and Cluster Size on Deep-Submicron FPGA Performance and Density," *FPGA 2000*, Feb. 2000, ACM, Monterey, California, USA.

Alexander, M.J., et al., "Placement and Routing for Performance-Oriented FPGA Layout," *VLSI Design: International Journal of Custom-Chip Design, Simulation, and Testing*, 1998 Month N/A, vol. 7, No. 1, pp. 1-23.

Backus, J., "Can Programming be Liberated from the Von Neumann Style? A Functional Style and its Algebra of Programs," *Communications of the ACM*, Aug. 1978, pp. 613-641, vol. 21, No. 8, ACM.

Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California, USA.

Butts, M., "Future Directions of Dynamically Reprogrammable Systems," *IEEE 1995 Custom Integrated Circuits Conference*, May 1995, pp. 487-494, IEEE.

Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.

Compton, K., et al., "An Introduction to Reconfigurable Computing," *IEEE Computer*, Apr. 2000.

Cong, J., et al., "Optimality and Stability Study of Timing-Driven Placement Algorithms," *ICCAD-2003, International Conference on Computer Aided Design*, Nov. 2003.

Dehon, A., "DPGA Utilization and Application," *Proceedings of the 1996 ACM Fourth International Symposium on Field-Programmable Gate Arrays FPGA*, Feb. 11-13, 1996, Monterey, California, USA.

Dehon, A., et al., "Reconfigurable Computing: What, Why, and Implications for Design Automation," *DAC 1999*, Jun. 1999, ACM, New Orleans, Louisiana.

Enzler, R., et al., "Virtualizing Hardware with Multi-Context Reconfigurable Arrays," *Lecture Notes in Computer Science*, Sep. 2003, pp. 151-160.

Giraud-Carrier, C., "A Reconfigurable Data Flow Machine for Implementing Functional Programming Languages," *SIGPLAN Notices*, Sep. 1994, vol. 29 (9): 22-28.

Goldstein, S.C., et al., "PipeRench: A Coprocessor for Streaming Multimedia Acceleration," *International Symposium on Computer Architecture (ISCA)*, May 1999, pp. 28-39.

Goldstein, S.C., et al., "PipeRench: A Reconfigurable Architecture and Compiler," *IEEE*, Apr. 2000, pp. 70-77, IEEE.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

Kaviani, A., et al., "Computational Field Programmable Architecture," *Custom Integrated Circuits Conference, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, California, USA.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005) 2005*, Apr. 18-20, 2005.

Lewis, D., et al., "The Stratix-II Routing and Logic Architecture," *Proceedings of the 2005 ACM/SIGDA 13th International Symposium on Field-Programmable Gate Arrays*, Feb. 20-22, 2005, pp. 1-22, Monterey, California, USA.

Ling, A., "The Search for the Optimal FPGA Logic Block," 2001 Month N/A, ACM.

M2000, "FlexEOS Embedded FPGA Cores," 2003 Month N/A, M2000.

Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "MATRIX: A Reconfigurable Computing Device with Configurable Instruction Distribution and Deployable Resources (Extended Abstract)," *Hot Chips Symposium 1997*, Aug. 1997.

Morris, K., "Lattice Launches XP: Non-Volatility at the Forefront of FPGA," *FPGA and Programmable Logic Journal*, Mar. 1, 2005, pp. 1-5, Techfocus Media, Inc.

Niedzielski, D., "An Overview of Reconfigurable Computing," NPL Date Unknown.

Ochotta, E.S., et al., "A Novel Predictable Segmented FPGA Routing Architecture," *FPGA 98*, Feb. 1998, pp. 3-11, ACM, Monterey, California, USA.

Pedram, M., "IEEE Circuits and Systems Society Distinguished Lecturer Program," NPL Date Unknown.

Perissakis, S., et al., "Embedded DRAM for a Reconfigurable Array," *Proceedings of the 1999 Symposium on VLSI Circuits*, Jun. 1999, slides 1-24.

Plunkett, B., et al., "Adapt2400 ACM Architecture Overview," *A Technology Whitepaper*, 2004 Month N/A, pp. 1-9, QuickSilver Technology, Inc.

Quicklogic Corp., "Ultra-Low Power FPGA Combining Performance, Density, and Embedded RAM," *Eclipse II Family Data Sheet*, Nov. 2005, pp. 1-92, QuickLogic Corporation, USA.

QuickSilver Technology, Inc., "InSpire SDK Tool Set," *Product Brief*, 2004 Month N/A, QuickSilver Technology, Inc., San Jose, California, USA.

QuickSilver Technology, Inc., "QS2412 adaptive Computing Machine," *Product Brief*, 2004 Month N/A, QuickSilver Technology, Inc., San Jose, California, USA.

Rose, J., "Hard vs. Soft: The Central Question of Pre-Fabricated Silicon," *34th International Symposium on Multiple-Valued Logic (ISML '04)*, May 2004, pp. 2-5.

Sankar, Y., "Ultra-Fast Automatic Placement for FPGAs," *A Thesis Submitted in Conformity with the Requirements for the Degree of Master of Applied Science Graduate Dept. of Electrical and Computer Engineering*, Univ. of Toronto, 1999 Month N/A, pp. ii-73.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, Nevada, USA.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18, 1997.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Singh, A., et al., "Interconnect Resource-Aware Placement for Hierarchical FPGAs," *Proceedings of the 2001 IEEE/ACM International Conference on Computer-Aided Design*, Nov. 2001.

Slade, A.L., et al., "Reconfigurable Computing Application Frameworks," *11th Annual IEEE Symposium on Field-Programmable Custom Computing Machines*, Apr. 9-11, 2003.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, Monterey, California, USA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, BC, Canada.

Trimberger, S., "Effects of FPGA Architecture on FPGA Routing," *32nd ACM/IEEE Design Automation Conference*, Jun. 1995, ACM.

Wilton, S.J.E., "Memory-to-Memory Connection Structures in FPGAs with Embedded Memory Arrays," *FPGA 97*, Feb. 1997, pp. 10-16, ACM, Monterey, California, USA.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

Zuchowski, P.S., "A Hybrid ASIC and FPGA Architecture," 2002 Month N/A, IEEE.

* cited by examiner

Signal Transit (e.g., 5000 ps)

OPERATIONAL TIME EXTENSION

CLAIM OF BENEFIT TO PRIOR APPLICATION

This application claims benefit of an earlier-filed U.S. Provisional Patent Application 60/632,277, entitled "Method and Apparatus for Sub-Cycle Assignment for a Reconfigurable IC," filed Dec. 1, 2004, which is incorporated herein by reference.

CROSS REFERENCE TO RELATED APPLICATIONS

This application is related to the following applications with the same filing date: U.S. patent application Ser. No. 11/081,823, filed Mar. 15, 2005; and U.S. patent application Ser. No. 11/081,854, filed Mar. 15, 2005.

FIELD OF THE INVENTION

The present invention is directed towards operational time extension.

BACKGROUND OF THE INVENTION

The use of configurable integrated circuits ("IC's") has dramatically increased in recent years. One example of a configurable IC is a field programmable gate array ("FPGA"). An FPGA is a field programmable IC that often has logic circuits, interconnect circuits, and input/output (I/O) circuits. The logic circuits (also called logic blocks) are typically arranged as an internal array of circuits. These logic circuits are connected together through numerous interconnect circuits (also called interconnects). The logic and interconnect circuits are often surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3 illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a. In some cases, the IC 300 includes hundreds or thousands of logic circuits 305 and interconnect circuits 310.

Some have recently suggested configurable IC's that are reconfigurable at runtime. The development of reconfigurable IC technology is relatively in its early stages. One area of this technology that has not yet been fully developed is how to assign different operations that the reconfigurable IC performs to different configuration periods during runtime. Accordingly, there is a need for a method of designing reconfigurable IC's that uses novel techniques to assign different operations performed by the reconfigurable IC to different configuration periods during runtime.

SUMMARY OF THE INVENTION

Some embodiments provide a reconfigurable intergrated circuit ("IC"). This IC has several reconfigurable circuits, each having several configurations for several configuration cycles. The reconfigurable circuits include several time-extending reconfigurable circuits. During the operation of the IC, each particular time-extending reconfigurable circuit maintains at least one of its configurations over at least two contiguous cycles, in order to allow a signal to propagate through a signal path, which contains the particular time-extending circuit, within a desired amount of time. Some embodiments provided a method of designing a reconfigurable IC that has several reconfigurable circuits, each having several configurations and operating in several reconfiguration cycles. The method identifies a signal path through the IC that does not meet a timing constraint the signal path includes several circuits, one of which is a particular reconfigurable circuit. The method then maintains a configuration of the particular reconfigurable circuit constant over at least two contiguous reconfiguration cycles in order to reduce signal delay through the signal path and thereby satisfy the timing constraint.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

Figure 1:
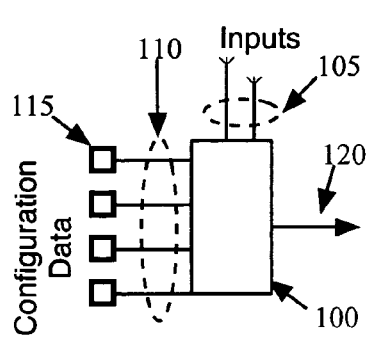
FIG. 1 illustrates an example of a configurable logic circuit.
Figure 2:
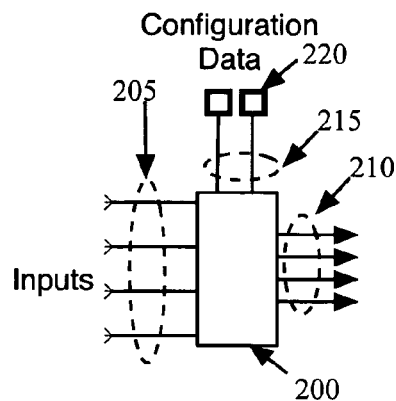
FIG. 2 illustrates an example of a configurable interconnect circuit.
Figure 3:
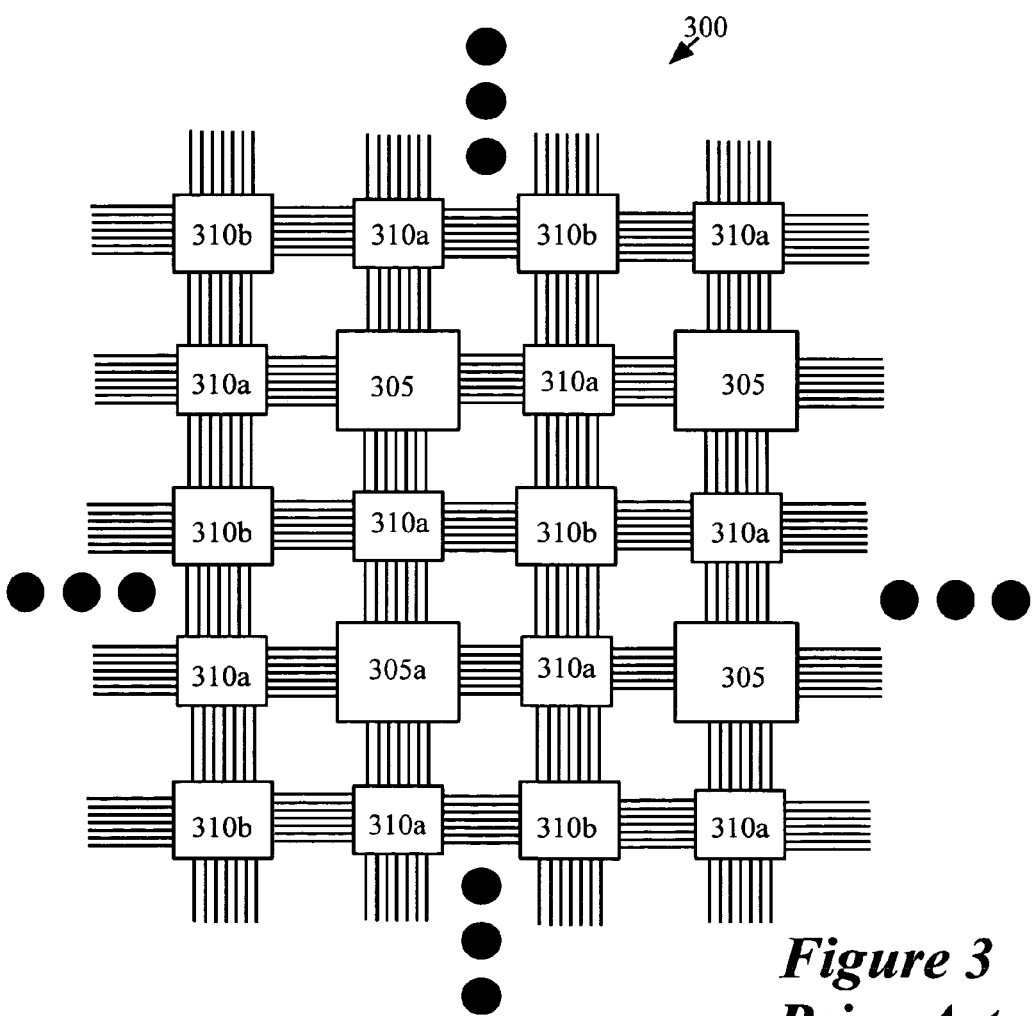
FIG. 3 illustrates a portion of a prior art configurable IC.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

For an IC that has several operational cycles, some embodiments of the invention provide a method that assigns the components in an IC design to different configurable circuits and different operational cycles of the IC. In some embodiments, this method is an optimization process that concurrently optimizes the assignment of the IC-design components to different configurable circuits and different operational cycles of the IC.

Several more detailed embodiments are described below. In these embodiments, the IC is a sub-cycle reconfigurable IC. Accordingly, these embodiments simultaneously optimize the physical design and sub-cycle assignment of a sub-cycle reconfigurable IC. One of ordinary skill will realize that other embodiments are not used for optimizing sub-cycle reconfigurable IC's. For instance, some embodiments are used to optimize simultaneously the physical design and reconfiguration cycle of a reconfigurable IC that does not reconfigure at a sub-cycle basis (i.e., reconfigures at a rate slower than a sub-cycle rate). Before describing these embodiments further, several terms and concepts are defined in Section I.

I. Terms and Concepts

A. Configurable IC

A configurable IC is an IC that has configurable circuits. In some embodiments, a configurable IC includes configurable computational circuit (e.g., configurable logic circuits) and configurable routing circuits for routing the signals to and from the configurable computation units. In addition to configurable circuits, a configurable IC also typically includes non-configurable circuits (e.g., non-configurable logic circuits, interconnect circuits, memories, etc.).

A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

Figure 4:
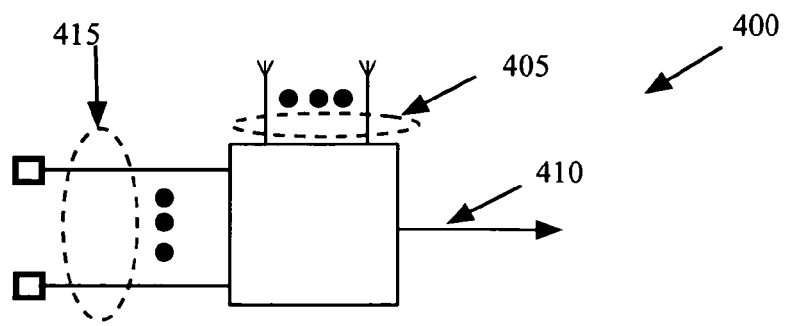
FIG. 4 illustrates an example of a configurable logic circuit that can perform a set of functions.

FIG. 4 illustrates an example of a configurable logic circuit 400 that can perform a set of functions. As shown in this figure, the logic circuit 400 has a set of input terminals 405, a set of output terminals 410, and a set of configuration terminals 415. The logic circuit 400 receives a set of configuration data along its configuration terminals 415. Based on the configuration data, the logic circuit performs a particular function within its set of functions on the input data that it receives along its input terminals 405. The logic circuit then outputs the result of this function as a set of output data along its output terminal set 410. The logic circuit 400 is said to be configurable as the configuration data set "configures" the logic circuit to perform a particular function.

Figure 5:
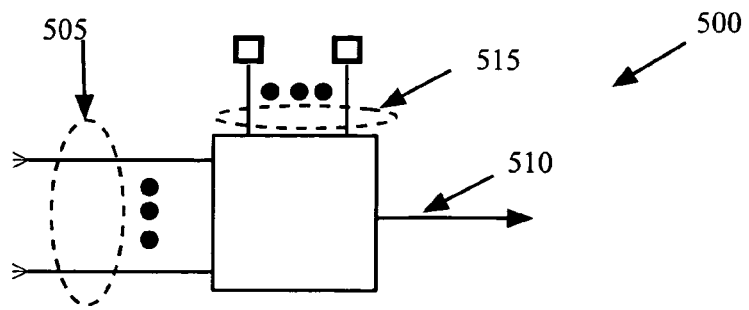
FIG. 5 illustrates an example of a configurable interconnect circuit.

A configurable interconnect circuit is a circuit that can configurably connect an input set to an output set in a variety of manners. FIG. 5 illustrates an example of a configurable interconnect circuit 500. This interconnect circuit 500 connects a set of input terminals 505 to a set of output terminals 510, based on a set of configuration data 515 that the interconnect circuit receives. In other words, the configuration data specify how the interconnect circuit should connect the input terminal set 505 to the output terminal set 510. The interconnect circuit 500 is said to be configurable as the configuration data set "configures" the interconnect circuit to use a particular connection scheme that connects the input terminal set to the output terminal set in a desired manner.

An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

B. Circuit and Configurable Node Arrays

Figure 6:
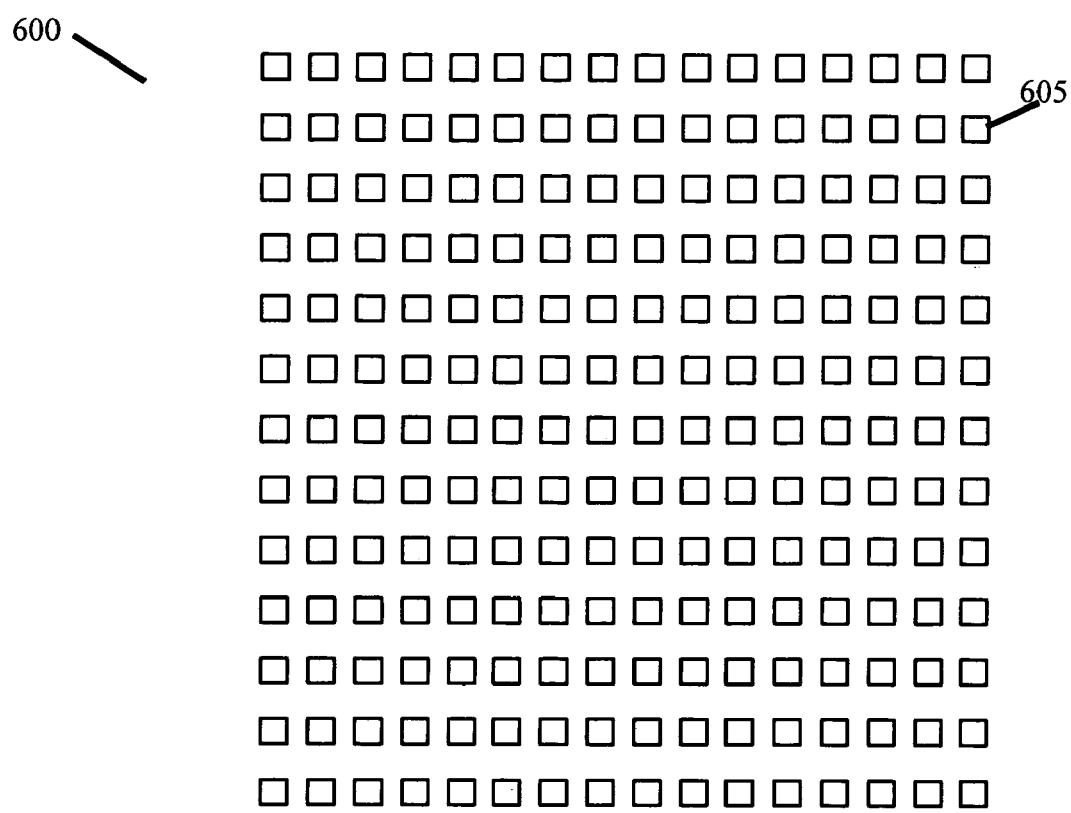
FIG. 6 illustrates an example of a configurable node array that includes configurable nodes that are arranged in rows and columns.

A circuit array is an array with several circuit elements that are arranged in several rows and columns. One example of a circuit array is a configurable node array, which is an array where some or all the circuit elements are configurable circuits (e.g., configurable logic and/or interconnect circuits). FIG. 6 illustrates an example of a configurable node array 600 that includes 208 configurable nodes 605 that are arranged in 13 rows and 16 columns. Each configurable node in a configurable node array is a configurable circuit that includes one or more configurable sub-circuits.

In some embodiments, some or all configurable nodes in the array have the same or similar circuit structure. For instance, in some embodiments, some or all the nodes have the exact same circuit elements (e.g., have the same set of logic gates and circuit blocks and/or same interconnect circuits), where one or more of these identical elements are configurable elements. One such example would be a set of nodes positioned in an array, where each node is formed by a particular set of logic and interconnects circuits. Having nodes with the same circuit elements simplifies the process for designing and fabricating the IC, as it allows the same circuit designs and mask patterns to be repetitively used to design and fabricate the IC.

In some embodiments, the similar configurable nodes not only have the same circuit elements but also have the same exact internal wiring between their circuit elements. For instance, in some embodiments, a particular set of logic and interconnects circuits that are wired in a particular manner forms each node in a set of nodes in the array. Having such nodes further simplifies the design and fabrication processes as it further simplifies the design and mask making processes.

In some embodiments, each configurable node in a configurable node array is a simple or complex configurable logic circuit. In some embodiments, each configurable node in a configurable node array is a configurable interconnect circuit. In such an array, a configurable node (i.e., a configurable interconnect circuit) can connect to one or more logic circuits. In turn, such logic circuits in some embodiments might be arranged in terms of another configurable logic-circuit array that is interspersed among the configurable interconnect-circuit array.

Also, some embodiments use a circuit array that includes numerous configurable and non-configurable circuits that are placed in multiple rows and columns. In addition, within the above described circuit arrays and/or configurable node arrays, some embodiments disperse other circuits (e.g., memory blocks, processors, macro blocks, IP blocks, SERDES controllers, clock management units, etc.).

Some embodiments might organize the configurable circuits in an arrangement that does not have all the circuits organized in an array with several aligned rows and columns. Accordingly, instead of referring to configurable circuit arrays, the discussion below refers to configurable circuit arrangements. Some arrangements may have configurable circuits arranged in one or more arrays, while other arrangements may not have the configurable circuits arranged in an array.

C. Reconfigurable IC

Reconfigurable IC's are one type of configurable IC's. Reconfigurable IC's are configurable IC's that can reconfigure during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data.

Figure 7:
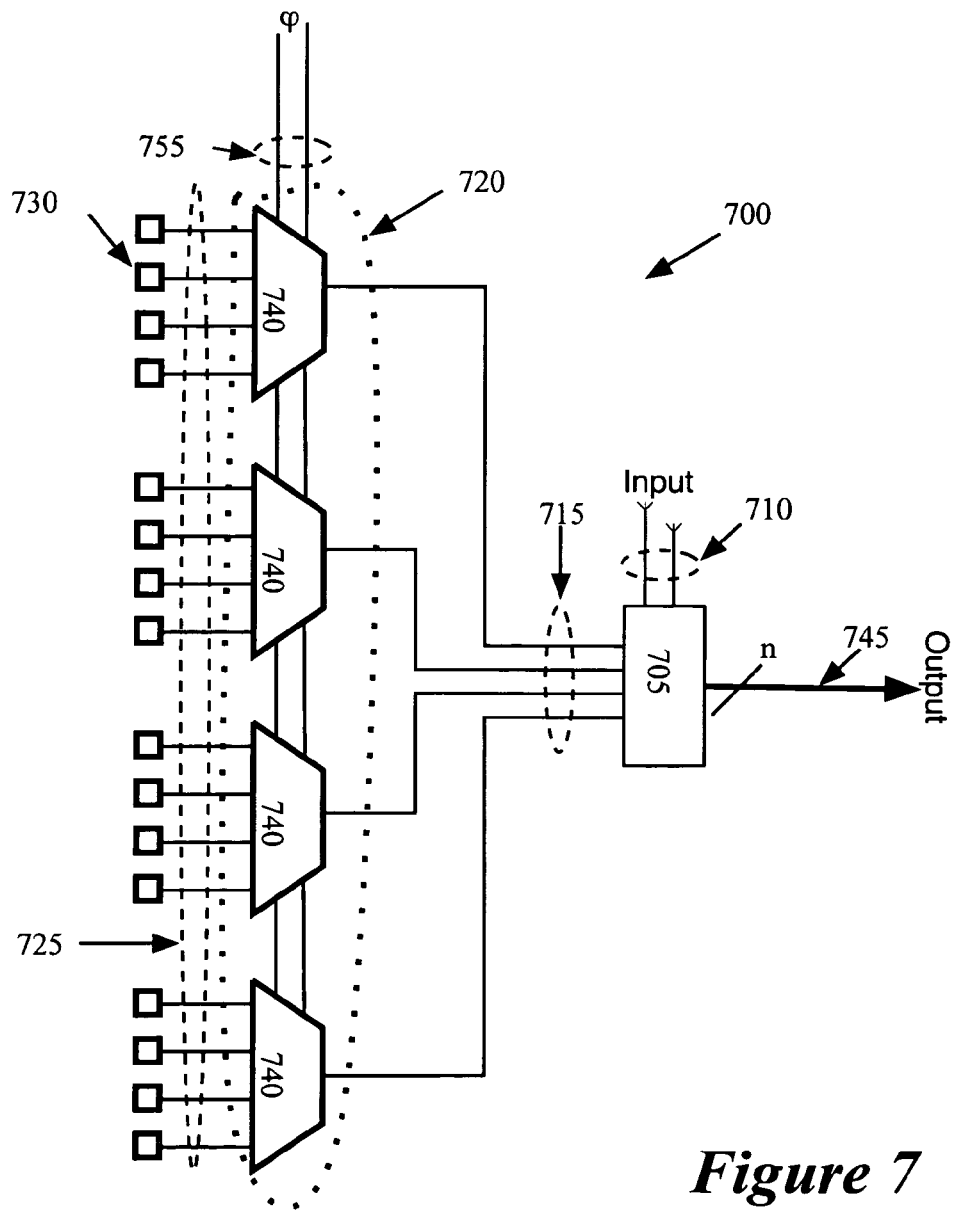
FIG. 7 illustrates an example of a reconfigurable logic circuit.

FIG. 7 illustrates an example of a reconfigurable logic circuit 700. This logic circuit includes a core logic circuit 705 that can perform a variety of functions on a set of input data 710 that it receives. The core logic circuit 705 also receives a set of four configuration data bits 715 through a switching circuit 720, which in this case is formed by four four-to-one multiplexers 740. The switching circuit receives a larger set of sixteen configuration data bits 725 that, in some cases, are stored in a set of storage elements 730 (e.g., a set of memory cells, such as SRAM cells). This switching circuit is controlled by a two-bit reconfiguration signal φ through two select lines 755. Whenever the reconfiguration signal changes, the switching circuit supplies a different set of four configuration data bits to the core logic circuit 705.

The configuration data bits then determine the function that the logic circuit 705 performs on its input data. The core logic circuit 705 then outputs the result of this function on the output terminal set 745.

Any number of known logic circuits (also called logic blocks) can be used in conjunction with the invention. Examples of such known logic circuits include look-up tables (LUT's), universal logic modules (ULM's), sub-ULM's, multiplexers, and PAL/PLA. In addition, logic circuits can be complex logic circuit formed by multiple logic and interconnect circuits. Examples of simple and complex logic circuits can be found in Architecture and CAD for Deep-Submicron FPGAs, Betz, et al., ISBN 0792384601, 1999; and in Design of Interconnection Networks for Programmable Logic, Lemieux, et al., ISBN 1-4020-7700-9, 2003. Other examples of reconfigurable logic circuits are provided in U.S. patent application Ser. No. 10/882,583, entitled "Configurable Circuits, IC's, and Systems," filed on Jun. 30, 2004. This application is incorporated in the present application by reference.

Figure 8:
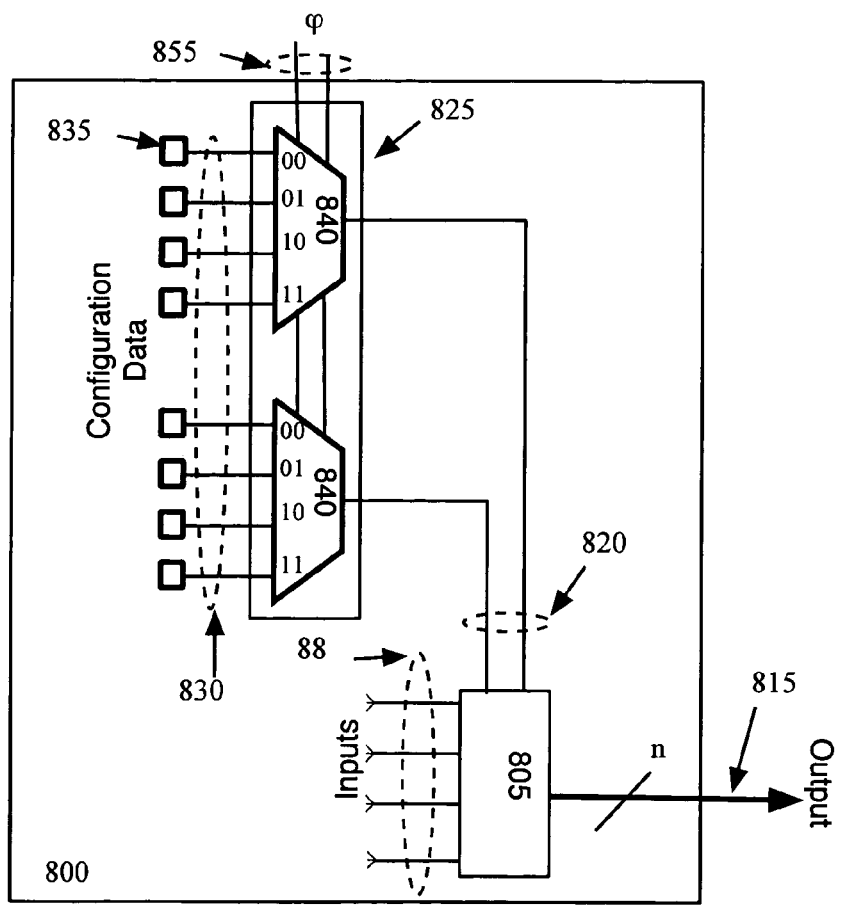
FIG. 8 illustrates an example of a reconfigurable interconnect circuit.

FIG. 8 illustrates an example of a reconfigurable interconnect circuit 800. This interconnect circuit includes a core interconnect circuit 805 that connects input data terminals 810 to an output data terminal set 815 based on a configuration data set 820 that it receives from a switching circuit 825, which in this example is formed by two four-to-one multiplexers 840. The switching circuit 825 receives a larger set of configuration data bits 830 that, in some embodiments, are stored in a set of storage elements 835 (e.g., a set of memory cells, such as SRAM cells). This switching circuit is controlled by a two-bit reconfiguration signal φ through two select lines 855. Whenever the reconfiguration signal changes, the switching circuit supplies a different set of two configuration data bits to the core interconnect circuit 805. The configuration data bits then determine the connection scheme that the interconnect circuit 805 uses to connect the input and output terminals 810 and 815.

Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented using a variety of known techniques and structures. Examples of interconnect circuits can be found in Architecture and CAD for Deep-Submicron FPGAs, Betz, et al., ISBN 0792384601, 1999, and in Design of Interconnection Networks for Programmable Logic, Lemieux, et al., ISBN 1-4020-7700-9, 2003. Other examples of reconfigurable interconnect circuits are provided in the U.S. patent application Ser. No. 10/882,583.

As mentioned above, the logic and interconnect circuits 700 and 800 each receive a reconfiguration signal φ. In some embodiments, this signal is a sub-cycle signal that allows the circuits 700 and 800 to reconfigure on a sub-cycle basis, i.e., to reconfigure one or more times within a cycle of a primary clock. The primary clock might be a design clock for which the user specifies a design. For instance, when the design is a Register Transfer Level (RTL) design, the design clock rate can be the clock rate for which the user specifies his or her design in a hardware description language (HDL), such as VHDL or Verilog. Alternatively, the primary clock might be an interface clock that defines the rate of input to and/or output from the IC (e.g., the rate that the fastest interface circuit of the IC passes signals to and/or receives signals from circuits outside of the IC).

Several novel techniques for distributing reconfiguration signals φ are described in U.S. patent application entitled "Configurable IC with Interconnect Circuits that also Perform Storage Operations", which is filed concurrently with the present application, with the Ser. No. 11/081,859. In conjunction with these clock distribution techniques, this application discloses several novel circuits for supplying configuration data to configurable circuits on a sub-cycle basis, based on the distributed clock signals.

D. Sub-Cycle Reconfigurable IC

Figure 9:
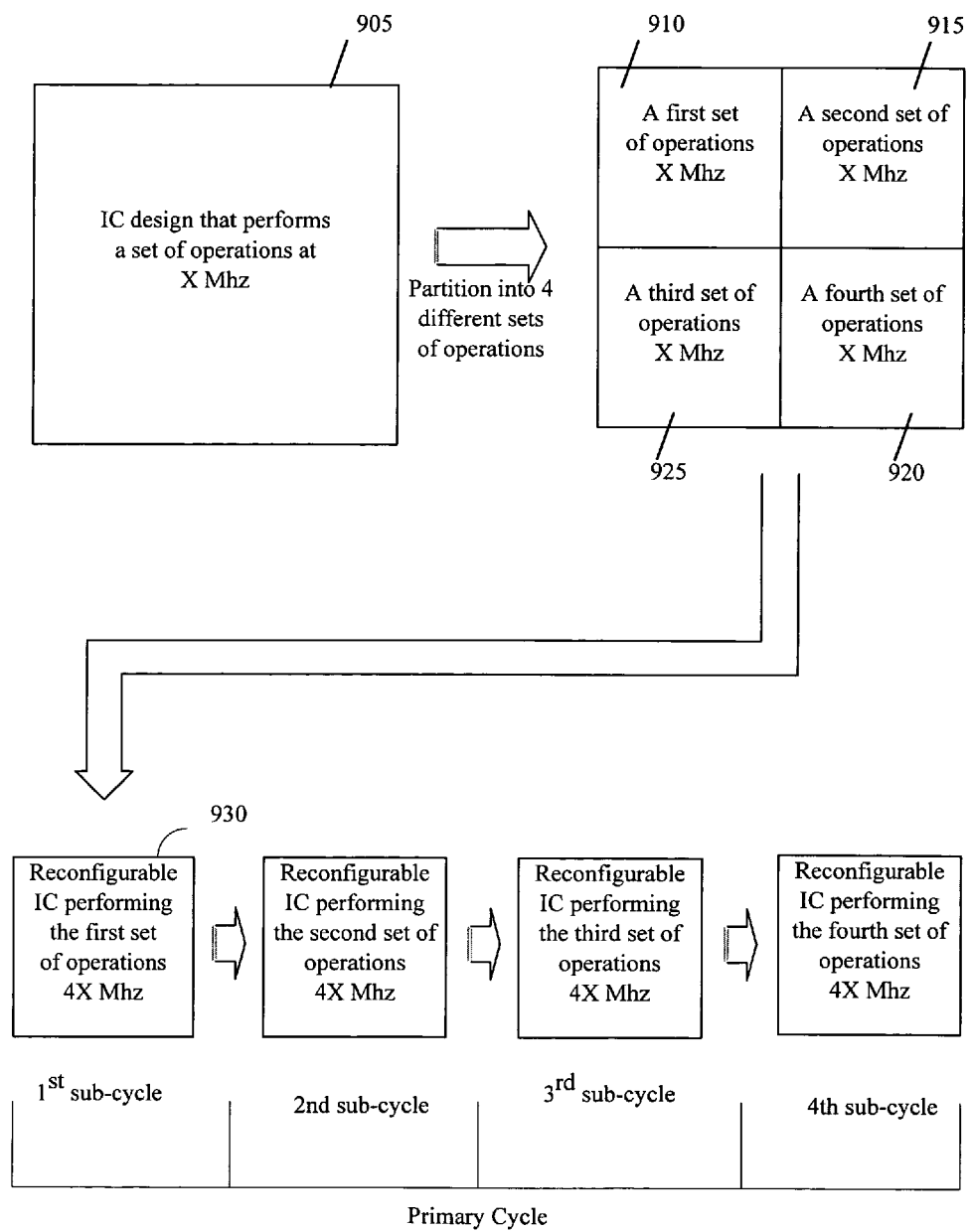
FIG. 9 conceptually illustrates an example of a sub-cycle reconfigurable IC.

FIG. 9 conceptually illustrates an example of a sub-cycle reconfigurable IC. Specifically, in its top left hand corner, this figure illustrates an IC design 905 that operates at a clock speed of X MHz. Typically, an IC design is initially specified in a hardware description language (HDL), and a synthesis operation is used to convert this HDL representation into a circuit representation. After the synthesis operation, the IC design includes numerous electronic circuits, which are referred to below as "components."

As further illustrated in FIG. 9, the operations performed by the components in the IC design 905 can be partitioned into four sets of operations 910–925, with each set of operations being performed at a clock speed of X MHz. FIG. 9 then illustrates that these four sets of operations 910–925 can be performed by one sub-cycle reconfigurable IC 930 that operates at 4× MHz. In some embodiments, four cycles of the 4× MHz clock correspond to four sub-cycles within a cycle of the X MHz clock. Accordingly, this figure illustrates the reconfigurable IC 930 reconfiguring four times during four cycles of the 4× MHz clock (i.e., during four sub-cycles of the X MHz clock). During each of these reconfigurations (i.e., during each sub-cycle), the reconfigurable IC 930 performs one of the identified four sets of operations. In other words, the faster operational speed of the reconfigurable IC 930 allows this IC to reconfigure four times during each cycle of the X MHz clock, in order to perform the four sets of operations sequentially at a 4× MHz rate instead of performing the four sets of operations in parallel at an X MHz rate.

Figure 10:
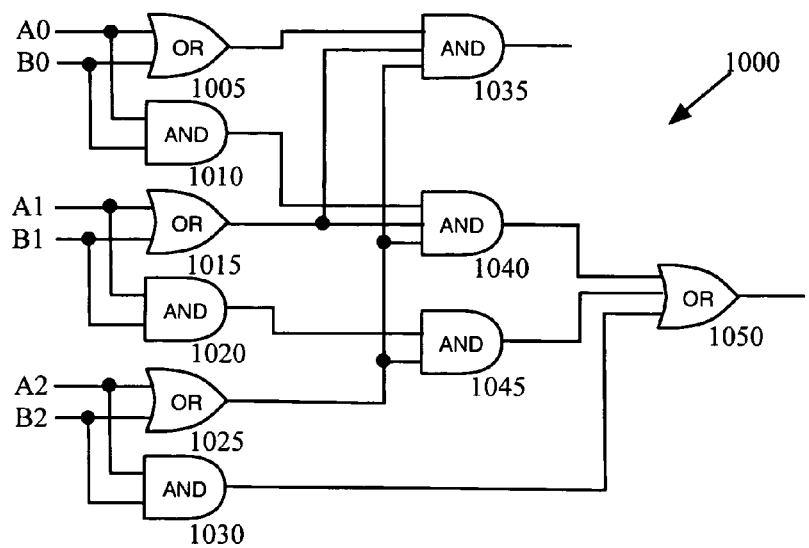
FIG. 10 illustrates a set of Boolean gates that compute two functions based on a set of inputs.

Sub-cycle configurability has many advantages. One advantage is that it allows a larger, slower IC design to be implemented by a smaller, faster IC design. FIGS. 10–15 present an example that illustrates this benefit. FIG. 10 illustrates a set of Boolean gates that compute two functions G3 and P3 based on a set of inputs A0, B0, A1, B1, A2, and B2. The set of Boolean gates has to compute these two functions based on the received input set in one design cycle. In this example, one design cycle lasts 10 ns, as the design clock's frequency is 100 MHz. However, in this example, each gate can operate at 400 MHz. Hence, each design cycle can be broken down into 4 sub-cycles of 2.5 ns duration, in order to meet the design clock frequency of 100 MHz.

Figure 11:
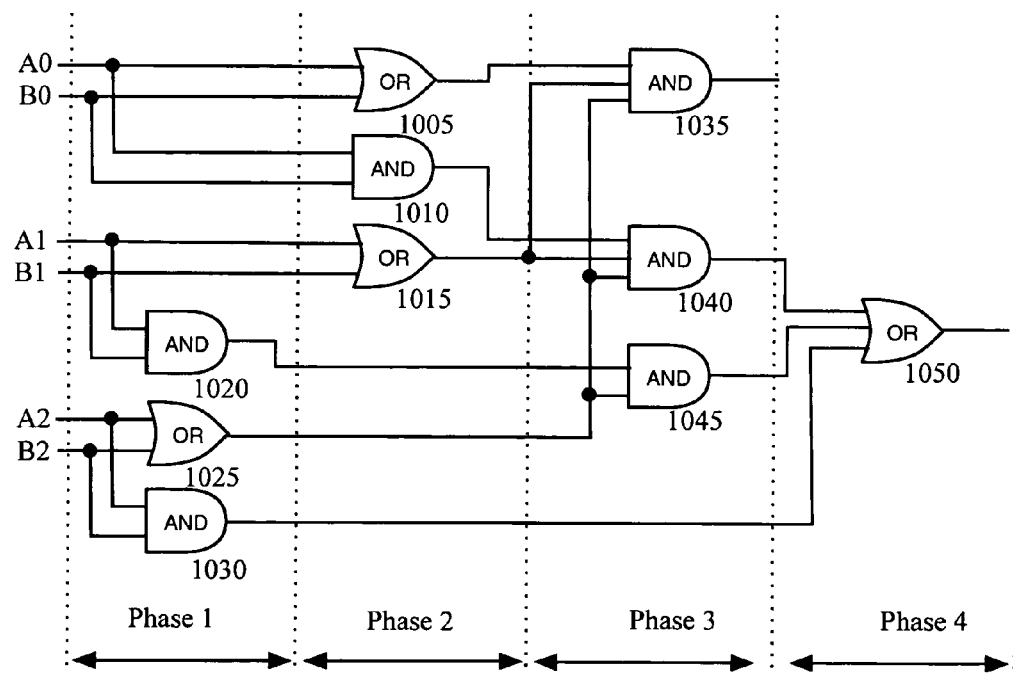
FIG. 11 illustrates the design of FIG. 10 after its gates have been placed into four groups.

FIG. 11 illustrates the design 1000 of FIG. 10 after its gates have been placed into four groups. These gates have been placed into four groups in order to break down the design 1000 into four separate groups of gates that can be configured and executed in four sub-cycles by a smaller group of gates. The groupings illustrated in FIG. 11 are designed to separate out the computation of different sets of gates while respecting the operational dependencies of other gates. For instance, gates 1005, 1010, and 1015 are defined as a separate group from gates 1020, 1025, and 1030, as these two sets of gates have no operational dependencies (i.e., the output of the gates in one set is not dependent on the output of the gates in the other set). As these two sets of gates have no operational dependencies, one set is selected for computation during the first sub-cycle (i.e., during phase 1), while the other set is selected for computation during the second sub-cycle (i.e., during phase 2). On the other hand, gates 1035, 1040, and 1045 are dependent on the outputs of the first two sets of gates. Hence, they are designated for configuration and execution during the third sub-cycle (i.e., during phase 3). Finally, the gate 1050 is dependent on the output of the first and third sets of gates, and thus it is designated for configuration and execution during the fourth sub-cycle (i.e., during phase 4).

Figure 12:
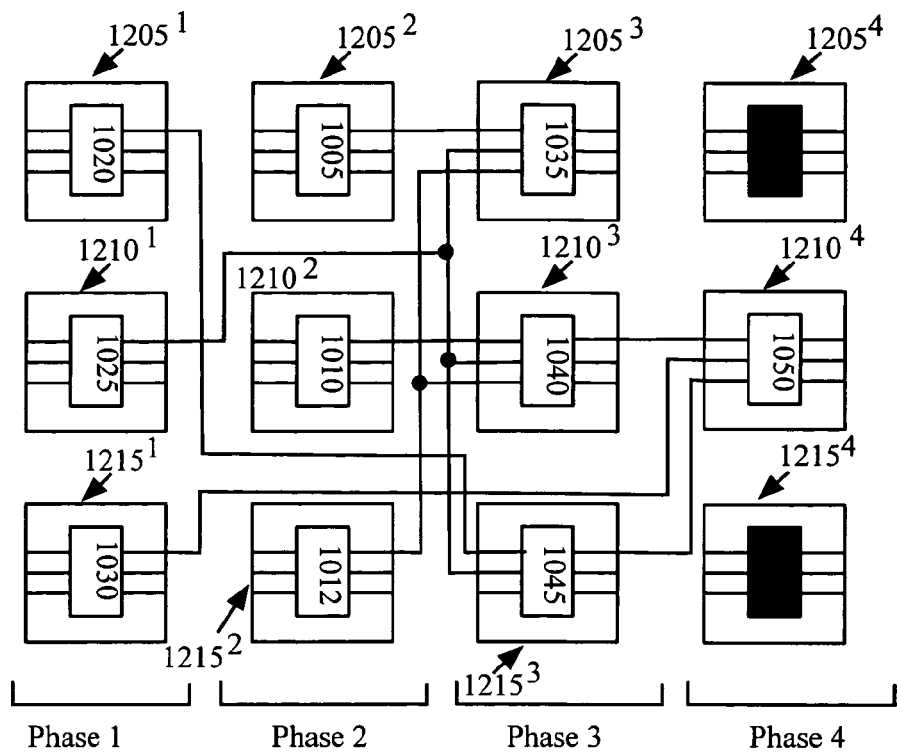
FIG. 12 illustrates another representation of the design of FIG. 10.

FIG. 12 illustrates another representation of the design 1000 of FIG. 10. Like FIG. 11, the schematic in FIG. 12 illustrates four phases of operation. However, now, each gate in the design 1000 has been replaced by a sub-cycle configurable logic circuit 1205, 1210, or 1215. Also, only three logic circuits 1205, 1210, and 1215 are used in FIG. 12, as each of the gates in FIG. 10 can be implemented by one logic circuit, and the groupings illustrated in FIGS. 11 and 12 require at most three gates to be execute during any given phase. (In FIG. 12, each logic circuit's operation during a particular phase is identified by a superscript; so, for example, reference numbers $1205^1$, $1205^2$, and $1205^3$, respectively, identify the operation of the logic circuit 1205 during phases 1, 2, and 3.)

As shown in FIG. 12, the outputs of certain logic circuits in earlier phases need to be supplied to logic circuit operations in the later phases. Such earlier outputs can be preserved for later computations by using state elements (such as registers or latches). Such state elements (not shown) can be standalone circuits or can be part of one or more interconnect circuits. For instance, in some embodiments, the state elements are storage elements that also (1) are interconnect circuits, (2) are part of interconnect circuits, or (3) are placed within or next to interconnect circuits.

Figure 13:
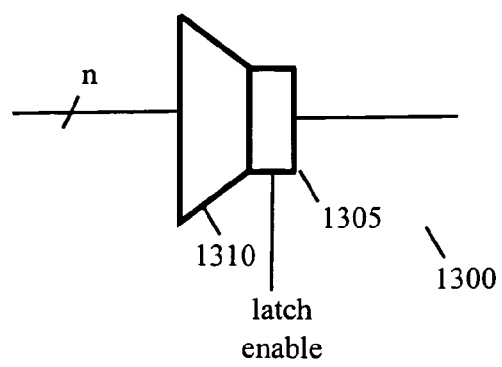
FIG. 13 illustrates a circuit representation of one such storage/interconnect circuit.

In some of these embodiments, such interconnect circuits are sub-cycle configurable interconnect circuits that are configured to connect the logic circuits in the desired manner. FIG. 13 illustrates a circuit representation of one such storage/interconnect circuit. This circuit 1300 is formed by placing a latch 1305 at the output stage of a multiplexer 1310. The latch 1305 receives a latch enable signal. When the latch enable signal is inactive, the circuit simply acts as an interconnect circuit. On the other hand, when the latch enable signal is active, the circuit acts as a latch that outputs the value that the circuit was previously outputting while serving as an interconnect circuit. Accordingly, when a second circuit in a second later sub-cycle needs to receive the value of a first circuit in a first earlier sub-cycle, the circuit 1300 can be used to receive the value in a sub-cycle before the second later sub-cycle (e.g., in the first earlier sub-cycle) and to latch and output the value to the second circuit in the second later sub-cycle. The circuit 1300 and other storage/interconnect circuits are further described in U.S. patent application entitled "Configurable IC with Interconnect Circuits that also Perform Storage Operations", which is filed concurrently with the present application, with the Ser. No. 11/081,859. This application is incorporated herein by reference.

FIGS. 10–12 illustrate that sub-cycle configurability allows a ten-gate design that operates at 100 MHz to be implemented by three sub-cycle configurable logic circuits and associated configurable interconnect circuits and state elements that operate at 400 MHz. Even fewer than three logic circuits might be necessary if one logic gate can perform the operation of two or more gates that are executing during each phase illustrated in FIG. 11.

II. Overview

Some embodiments of the invention assign the components in the IC design to different reconfigurable circuits and different sub-cycles of a sub-cycle reconfigurable IC. Some of these embodiments utilize an optimizer that concurrently optimizes the assignment of the IC-design components to different locations (i.e., different physical circuit sites) and different sub-cycles of a sub-cycle reconfigurable IC. Before describing these embodiments, several terms need to be further defined.

Figure 14:
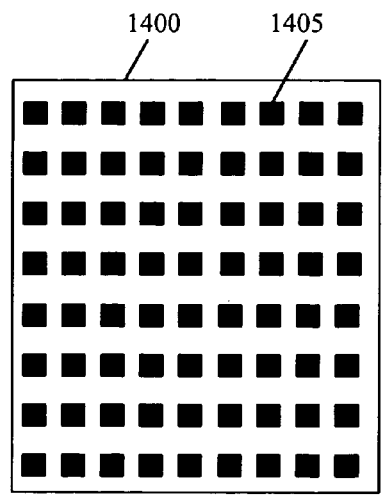
FIG. 14 illustrates an example of an IC design that includes seventy-two design components.
Figure 15:
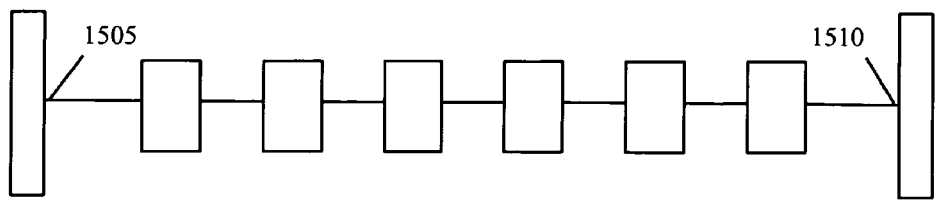
FIG. 15 illustrates a path through a set of components that are communicatively coupled to pass data to and receive data from each other.

A configurable or non-configurable IC design includes numerous circuits (referred to below as design components). For instance, FIG. 14 illustrates an example of an IC design 1400 that includes seventy-two design components 1405. In an IC design, each component lies on one or more signal paths ("paths"). For instance, FIG. 15 illustrates a path through a set of components that are communicatively coupled to pass data to and receive data from each other. As shown in this figure, a path has two endpoints, a source point 1505 and a target point 1510. The source and target designations of the endpoints are based on the direction of the signal flow through the path.

Figure 16:
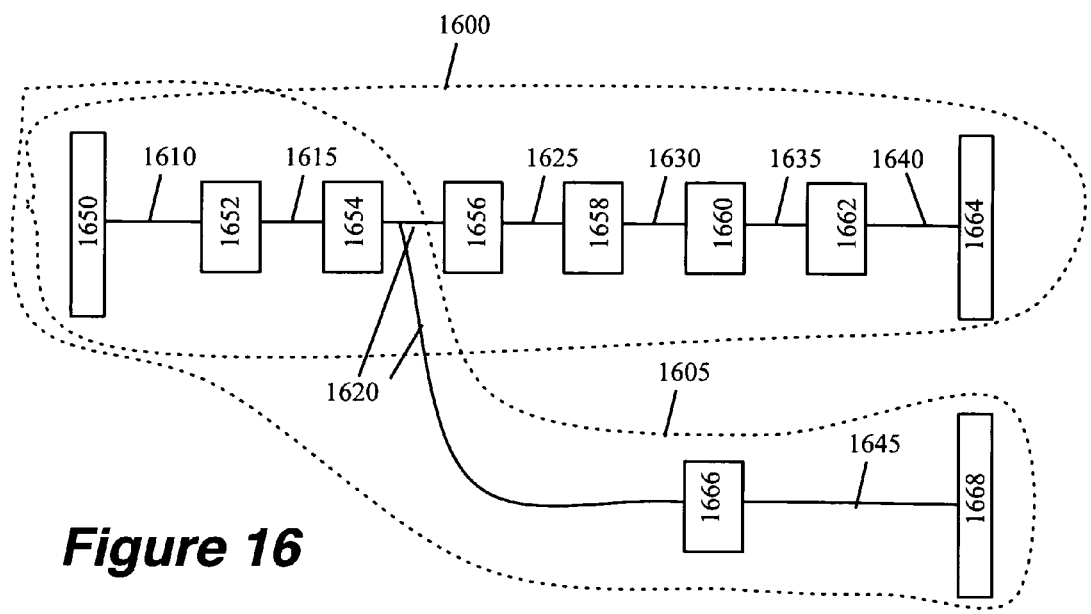
FIG. 16 illustrates an example of two paths that are established by eight nets.

An IC design also includes numerous nets, where each net specifies a set of component terminals that need to be connected (i.e., each net specifies the interconnection of a set of component terminals). For instance, FIG. 16 illustrates an example of two paths 1600 and 1605 that are established by eight nets 1610–1645. Seven nets 1610–1640 establish the path 1600 through user register 1650, components 1652–1662, and user register 1664. Four nets 1610–1620 and 1645 establish the path 1605 through user register 1650, components 1652, 1654, and 1666, and user register 1668. Except net 1620, all nets are two terminal nets (i.e., connect two terminals). Net 1620 is a three terminal net (i.e., connects three terminals).

Figure 17:
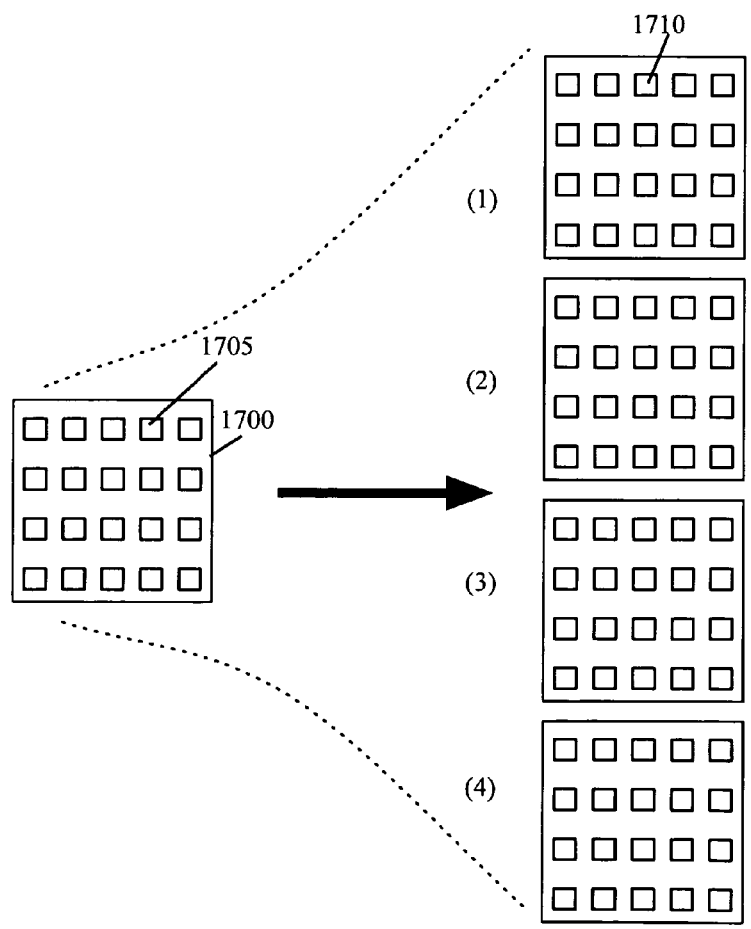
FIG. 17 illustrates an example of a reconfigurable IC design that has twenty reconfigurable circuits.

A reconfigurable IC design includes numerous reconfigurable circuits, where each reconfigurable circuit is at a physical circuit site in the reconfigurable IC design. For instance, FIG. 17 illustrates an example of a reconfigurable IC design 1700 that has twenty reconfigurable circuits 1705. In each sub-cycle, each reconfigurable circuit can be reconfigured to act as a different configured circuit. Each particular configured circuit exists at a particular operational circuit site, which is at a particular physical circuit site in a particular sub-cycle. For example, FIG. 17 illustrates that, in four sub-cycles, the twenty reconfigurable circuits 1705 can serve as eighty configured circuits that are at eighty operational circuit sites.

Figure 18:
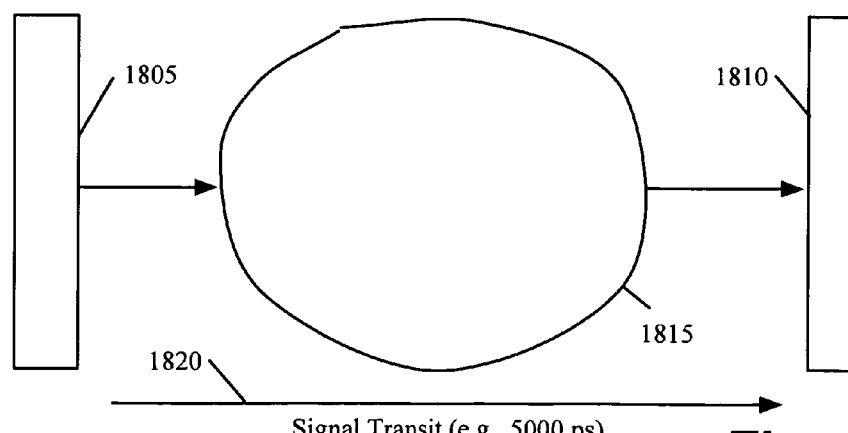
FIG. 18 pictorially illustrates the relationship between the shortest signal transit delay in an IC design and the duration of sub-cycles in a reconfigurable IC.

FIG. 18 pictorially illustrates the relationship between the shortest signal transit delay in an IC design and the duration of sub-cycles in a reconfigurable IC. Specifically, this figure illustrates a set of input registers 1805, a set of output registers 1810, and a collection 1815 of design components between the register sets 1805 and 1810. The collection 1815 of design components perform numerous operations on the data received by the input register set 1805 to produce the data that the design supplies to the output register set 1810. FIG. 18 pictorially illustrates the collection 1815 of design components in terms of a bubble, to pictorially convey a general collection of components.

FIG. 18 also illustrates an arrow 1820 that represents the shortest signal transit for data to propagate from the input register set 1805 to the output register set 1810 through the components 1815. This shortest signal transit can be used (e.g., by the invention's optimizer) to specify a duration for each sub-cycle of the reconfigurable IC that will implement the IC design of FIG. 18. For instance, the duration of each sub-cycle might be specified as 950 ps when the reconfigurable IC has four sub-cycles and the shortest signal transit between the input and output register sets is 5000 ps.

Some embodiments of the invention utilize an optimizer that assigns the components in the IC design to different locations (i.e., different physical circuit sites) and/or different sub-cycles of a sub-cycle reconfigurable IC. In other words, the invention's optimizer optimizes the assignment of IC-design components to different operational circuit sites, where some of the operational circuit sites exist in different sub-cycles. Accordingly, the optimizer concurrently optimizes the physical-location and sub-cycle assignments of the IC-design components.

Assigning a particular IC-design component to a particular operational circuit site that is defined at a particular physical circuit site in a particular sub-cycle, means that the reconfigurable circuit at the particular physical circuit site is configured during the particular sub-cycle to perform the operation of the particular IC-design component (i.e., means that the reconfigurable circuit at the particular physical circuit site is to be assigned a configuration data set during the particular sub-cycle that would configure the reconfigurable circuit to perform the operation of the particular IC-design component).

Figure 19:
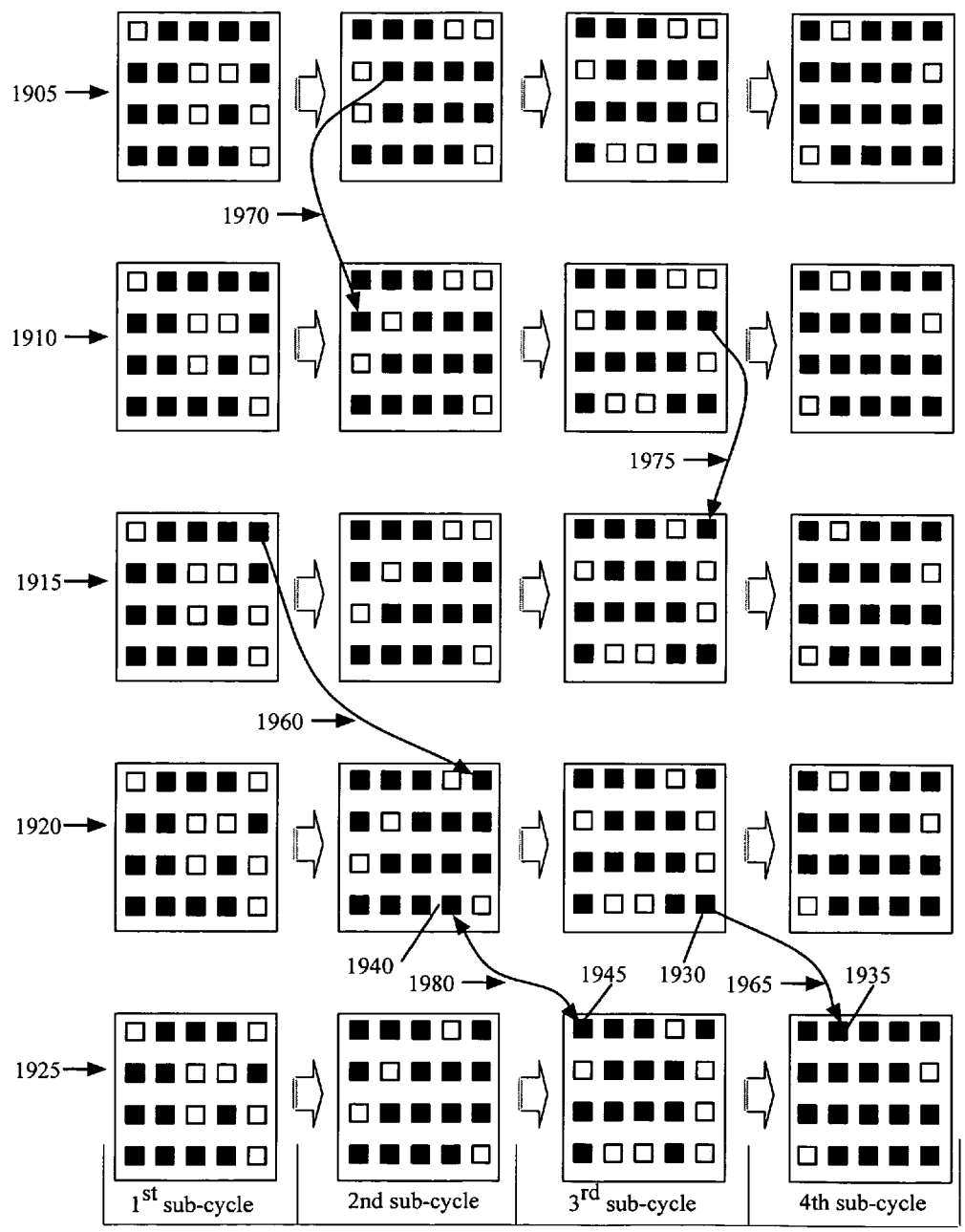
FIG. 19 illustrates an example of this concurrent optimization for the examples illustrated in FIGS. 14 and 17.

FIG. 19 illustrates an example of this concurrent optimization for the examples illustrated in FIGS. 14 and 17. FIG. 19 has numerous rows, where each row illustrate a particular assignment of the seventy-two components 1405 in the IC design 1400 of FIG. 14 to seventy-two operational circuit sites of the reconfigurable IC design 1700 of FIG. 17. For instance, the top row 1905 in this figure illustrates an initial assignment of the seventy-two components 1405. As shown in this top row, the initial assignment includes fourteen IC-design components in sub-cycle 1, fifteen IC-design components in sub-cycle 2, fourteen IC-design components in sub-cycle 3, and seventeen IC-design components in sub-cycle 4.

The first row 1905 and the second row 1910 of FIG. 19 illustrate the reassignment 1970 of one of the IC-design components from one operational circuit site within the second sub-cycle to another operational circuit site within the second sub-cycle. Similarly, the second and third rows 1910 and 1915 illustrate the reassignment 1975 of a component from one operational circuit site within the third sub-cycle to another operational circuit site within the third sub-cycle. The movements illustrated between the first and second rows and between the second and third rows are simply movements in the x- and y-locations of the assignments of an IC-design component during a particular sub-cycle.

The invention's optimizer, however, also allows for the reassignment of the operation of an IC-design component to a different sub-cycle. In other words, the invention's optimizer allows for the reassignment of an IC-design component to a different operational circuit site (that can be at the same physical circuit site or at a different physical circuit site) in a different sub-cycle.

FIG. 19 illustrates two examples of such temporal movements. Specifically, the third and fourth rows 1915 and 1920 illustrate the reassigning 1960 of a design component from an operational circuit site in the first sub-cycle to an operational circuit site in the second sub-cycle. This reassignment is simply a reassignment in time as both operational circuit sites are at the same physical circuit site in the reconfigurable IC.

The fourth and fifth rows 1920 and 1925, on the other hand, illustrate an example of a reassignment that is in both time and x-/y-location of the operational circuit sites. Specifically, these two rows illustrate the reassigning 1965 of a component from a first operational circuit site 1930 in the third sub-cycle to a second operational circuit site 1935 in the fourth sub-cycle, where the second operational circuit site is three rows above and three columns to the left of the first operational circuit site.

The fourth and fifth rows 1920 and 1925 also illustrate an example of a move that interchanges the time and x-/y-locations of two components in the IC design. Specifically, this figure illustrates the interchanging 1980 of the position of two components at two operational circuit sites 1940 and 1945 in two different sub-cycles (i.e., the second and third sub-cycles). This interchanging pictorially illustrates the swapping of the sub-cycle and physical-location assignment of two IC-design components that are implemented by two reconfigurable circuits in the reconfigurable IC.

III. Overall Flow of Some Embodiments

Figure 20:
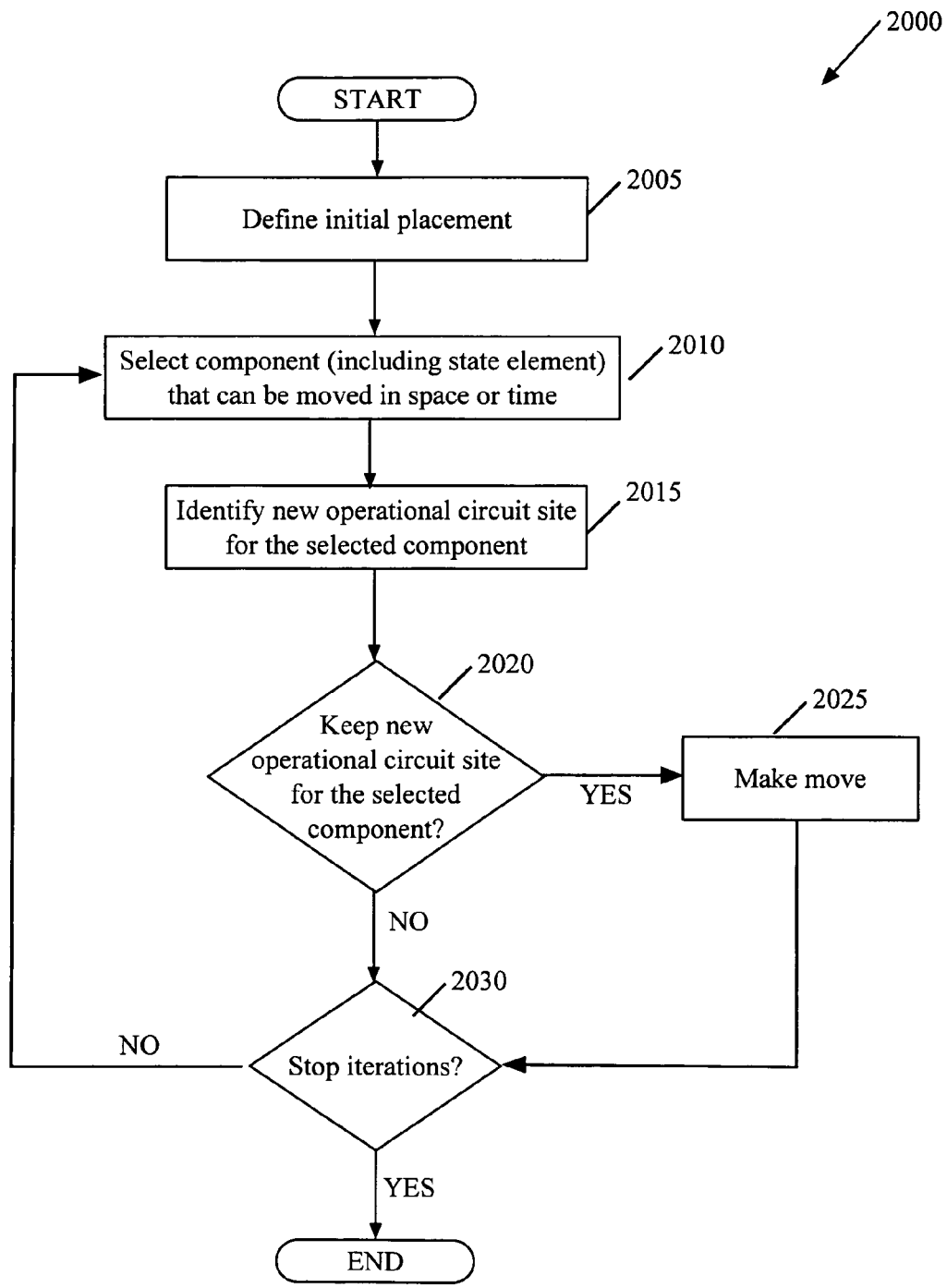
FIG. 20 conceptually illustrates an optimization process that the optimizer of some embodiments performs.

FIG. 20 conceptually illustrates an optimization process 2000 that the optimizer of some embodiments performs. The optimization process 2000 assigns the circuits in an IC design to different locations (i.e., different physical circuit sites) and/or different sub-cycles of a sub-cycle reconfigurable IC that will implement the IC design. In other words, this process simultaneously optimizes the physical-location and sub-cycle assignments of the IC-design components within the reconfigurable IC.

In some embodiments, this optimization process is performed by a placer that identifies the physical-location and sub-cycle assignment of the IC-design components. In other embodiments, a combined placer/router tool performs the optimization process 2000 (1) to specify the design component's physical-location and sub-cycle assignments, and simultaneously (2) to specify the interconnections between these circuits (e.g., to specify the interconnect circuits between the assigned design components).

As shown in FIG. 20, the process 2000 initially identifies (at 2005) a starting operational circuit site (i.e., an initial physical location and sub-cycle) for each design component that it has to place. This identification entails assigning an initial sub-cycle for each circuit in each path in the IC design. The initial sub-cycle assignment in some embodiments involves (1) performing a topologic sort of the components based on their positions in their respective paths, and (2) dividing the sorted components between the different sub-cycles based on this sort.

An IC-design component might be on multiple paths. Accordingly, in some embodiments, the topological sort entails computing for each component a topological metric value that accounts for all the paths that contain the particular component. Some embodiments compute the topological metric value for a particular component by (1) identifying the maximum distance $D_{MAXSRC}$ between the particular component to the source point of any path that contains the particular component, (2) identifying the maximum distance $D_{MAXTGT}$ between the particular component to the target point of any path that contains the particular component, and (3) expressing the topological metric value as a normalized distance metric equal to $$\frac{D_{MAXSRC}}{D_{MAXSRC} + D_{MAXTGT}}.$$

Different embodiments express distance values (e.g., the distance between a component and a source or target point of a path) differently. For instance, some embodiments express the distance between a particular component and a point in the path (1) in terms of the number of intervening components between the particular component and the point, (2) in terms of the overall signal delay through the intervening components, or (3) in terms of a combination of the number, signal delay, or other attributes of the intervening components.

Figure 21:
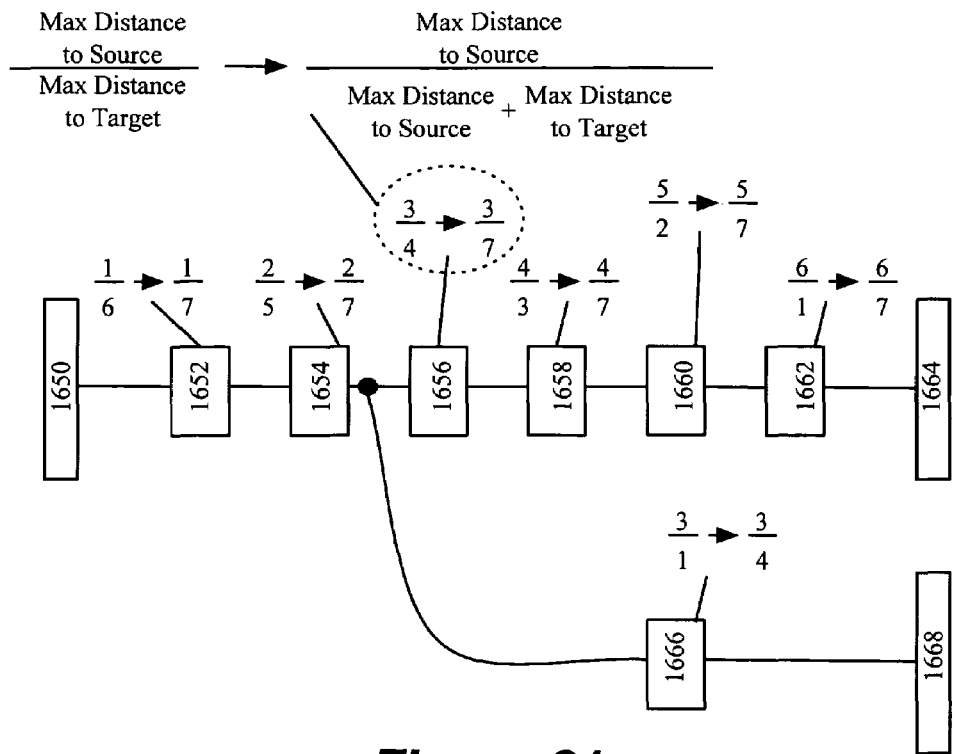
FIG. 21 illustrates an example of computing the normalized metric value for the components of the paths of FIG. 16.

FIG. 21 illustrates an example of computing the normalized metric value for the components of the paths 1600 and 1605 of FIG. 16. In this example, it is assumed that the components on the paths 1600 and 1605 are not on any other paths. Also, in this example, the distance between a particular component and a source or target point is expressed in terms of the number of components (including the particular component) between the output or input of the particular point and the source or target point. For instance, component 1654 has two components (including itself) between its output and register 1650, whose output is the source point for both paths 1600 and 1605. The component 1654 has five components (including itself) between its input and register 1664, whose input is the target point for path 1600.

For each component, FIG. 21 illustrates (1) the maximum source/target distance between the particular component and a source/target of a path on which the component resides and (2) the normalized distance metric that is computed based on these maximum distance values. For example, the distance between the component 1654 and the target of path 1600 is five, while its distance to the target of path 1605 is two. The maximum distance between the component 1654 and the source point of path 1600 or 1605 is two. Hence, FIG. 21 illustrates that the maximum distance between the component 1654 and the targets of the paths on which the component 1654 resides is five, and the maximum distance between this component and the sources of the paths on which it resides is two. Based on these two values, the normalized distance metric for the component 1654 is $2/7$, as illustrated in FIG. 21.

After computing the normalized distance metric for each circuit in the path, the optimizer sorts (at 2005) the circuits in the path according to an ascending order of normalized distance metric values. The process then assigns (at 2005) circuits to different sub-cycles based on this order. For instance, in some embodiments that employ a four sub-cycle reconfigurable IC, the process might assign (1) the first quarter of the circuits with the lowest normalized distance metric values to the first sub-cycle, (2) the second quarter of the circuits with the next lowest normalized distance metric values to the second sub-cycle, (3) the third quarter of the circuits with the next lowest normalized distance metric values to the fourth sub-cycle, and (4) the last quarter of the circuits with the next lowest normalized distance metric values to the fourth sub-cycle.

Figure 22:
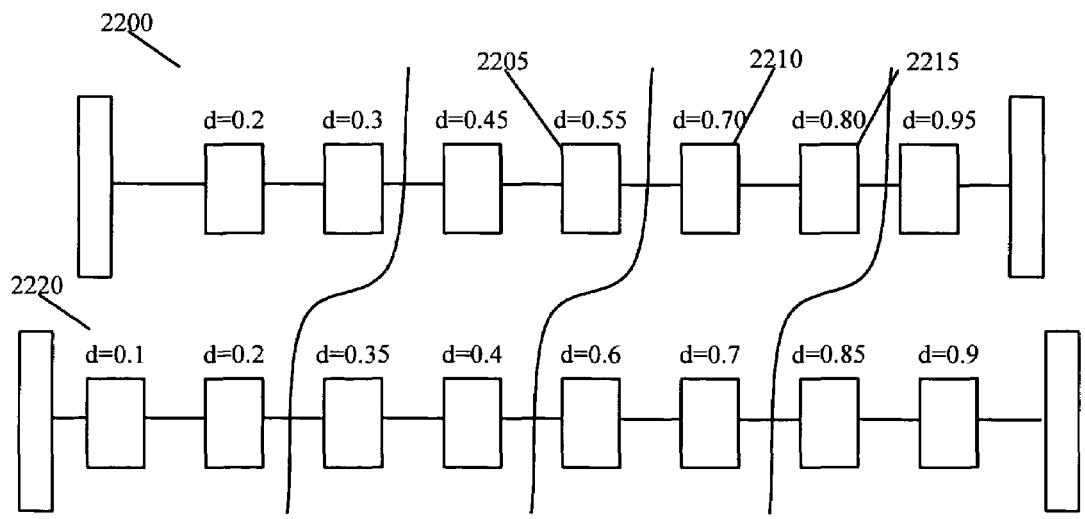
FIG. 22 illustrates two examples of assigning the circuits of two paths to different sub-cycles according to the above-described approach.

FIG. 22 illustrates two examples of assigning the circuits of two paths 2200 and 2220 to different sub-cycles according to the above-described approach. In these examples, the first quarter of the IC-design components have a normalized distance metric that is not greater than 0.35, the second quarter of the IC-design components have a normalized distance metric that is not greater than 0.6, the third quarter of the IC-design components have a normalized distance metric that is not greater than 0.85, and the fourth quarter of the IC-design components have a normalized distance metric that is not less than 0.85.

Figure 23:
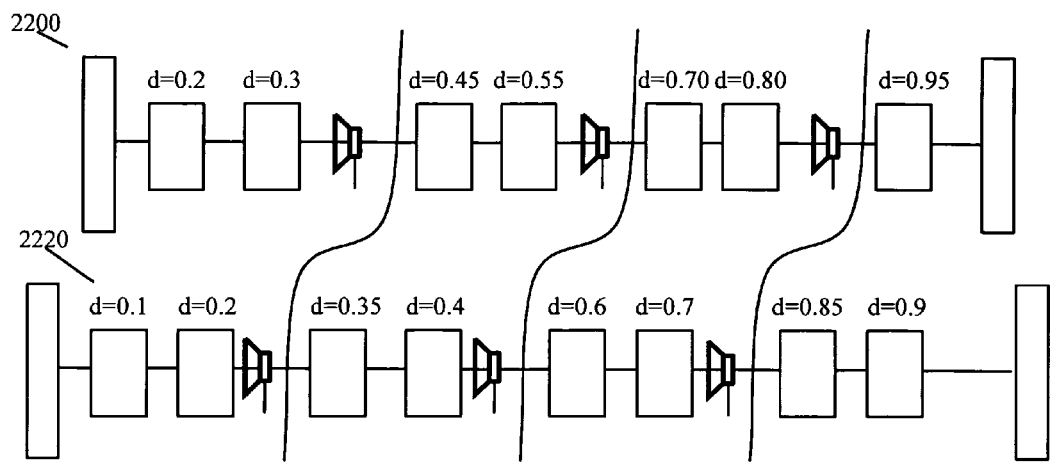
FIG. 23 illustrates several state elements that are defined at the sub-cycle boundaries for the examples illustrated in FIG. 22.

Near each sub-cycle transition between an earlier sub-cycle and a later sub-cycle, the process specifies (at 2005) state elements to maintain the path's state at the end of the earlier sub-cycle for the first circuit in the later sub-cycle. As mentioned above, some embodiments use interconnect/storage circuits as such state elements. FIG. 23 illustrates several state elements 2305 that are defined at the sub-cycle boundaries for the examples illustrated in FIG. 22. In some embodiments, a state element can also be defined behind one or more circuits that are closer to a sub-cycle boundary.

Also, in some cases, the state elements specified at 2005 are state elements that are inserted after the identification (at 2005) of the initial sub-cycle assignment. In other cases, these elements are circuit-path interconnects that operate as interconnects in one sub-cycle, and operate as a storage element in the subsequent sub-cycle. Such could be the case, for instance, in the embodiments that use the process 2000 as part of a placer/router that specifies the physical location and sub-cycle assignment of both logic and interconnect circuits.

After identifying the initial sub-cycle assignment and specifying the state elements at the sub-cycle boundaries, the process 2000 defines (at 2005) an initial location for the circuits (including the state elements) in each path. The initial location for each circuit is a random location. The initial location for each circuit might result in several paths that exceed sub-cycle time allocations in one or more sub-cycles.

After specifying (at 2005) the initial placement, the process 2000 selects (at 2010) a circuit (i.e., a design component or state element) that can be assigned a new physical location and/or a new sub-cycle. After selecting (at 2010) a circuit that can be reassigned in space or in time, the process identifies (at 2015) a potential "move" for the selected circuit. In some embodiments, identifying a potential move entails identifying a new operational circuit site (i.e., a new physical location and/or a new sub-cycle) for the selected circuit. In some cases, the identified new operational circuit site might be associated with another circuit, when it is identified as a new potential circuit site for the selected circuit. Hence, in these cases, the move entails swapping the temporal and/or physical location of the selected circuit with the temporal and/or physical location of another circuit, which has to be a "moveable" circuit in the embodiments that have temporal restrictions on moving circuits.

In some embodiments, the process does not select (at 2015) a potential move that causes the violation of one or more particular timing rules. One example of such a timing rule is a prohibition of some embodiments against allowing a first circuit that is earlier than a second circuit in a path to be placed in a sub-cycle that is later than the currently assigned sub-cycle of the second circuit. Specifically, in some embodiments, the optimization process 2000 cannot always reassign a particular circuit from a first operational circuit site in a first earlier sub-cycle to a second operational circuit site in a second later sub-cycle, when the particular circuit is part of a path that has another circuit that (1) is after the particular circuit in the path, but (2) is before the second sub-cycle.

Instead of, or in conjunction with this timing rule, some embodiments consider at 2015 other timing rules. One example of such a timing rule is a prohibition against two circuits occupying the same operational circuit site. Another example of such a timing rule is a prohibition against exceeding sub-cycle timing constraints with respect to logical depth or delay. Section IV provides several examples of timing constraints relating to overall signal path delay and sub-cycle signal path delay.

Other embodiments, however, do not place such restrictions on reassigning circuits to different sub-cycles. For instance, some embodiments allow a first circuit in a path that is before a second circuit in the path to be placed in a sub-cycle that is after the second circuit's sub-cycle, as these embodiments account for the toroidal nature of sub-cycle reconfiguration. These embodiments might allow a path's earlier circuit to be placed in a second sub-cycle that is after a first sub-cycle that contains the path's later circuit. These embodiments would allow such an assignment as the second sub-cycle in a first primary cycle would be before the first sub-cycle in a second primary cycle that is after the first primary cycle.

However, in some of the embodiments, the optimization process 2000 can make moves that violate one or more timing rules, but penalizes such moves when costing them (at 2020). Penalizing moves are further described below. Some embodiments do not allow moves that violate certain timing rule or rules, while allowing but penalizing moves that violate other timing rule or rules.

Once the process identifies a new physical and/or temporal location for the selected circuit, the process determines (at 2020) whether to assign the newly identified operational circuit site to the selected circuit. In some embodiments, this determination includes computing a cost for the potential new assignment (or assignments in case of a swap) and then making a determination based on this cost whether to accept the new assignment (or assignments).

Three issues need to be considered in performing this computation and determination. The first issue is whether the computed cost expresses a delta cost associated with a potential move, or whether the computed cost expresses the overall cost of the design (e.g., the overall cost of the placement in some embodiments, or the placement and routing in other embodiments). In other words, the computed cost expresses different costs in different embodiments of the invention.

In some embodiments, the computed cost is a delta cost associated with the potential move. In some of these embodiments, this delta cost can be a positive or negative cost, where, in some embodiments, a negative cost implies an improvement in the design (e.g., in a temporal or physical placement and/or routing in the design), while a positive cost implies deterioration in the design.

In other embodiments, the computed cost is the overall cost of the design when the selected circuit is placed at the newly identified operational circuit site, which, as mentioned above, might entail the movement of another circuit to the selected circuit's current operational site. In yet other embodiments, the computed cost expresses a combination of a delta cost and an overall cost.

The second issue is whether the computed cost expressly accounts for a physical-location reassignment, a sub-cycle reassignment, or both. A physical-location reassignment is a reassignment to a new operational circuit site that is at a different physical circuit site than the current operational circuit site of the circuit. Some embodiments compute a cost for a new potential physical location for the selected circuit based on traditional metrics that account for the change in the expected wire length and/or congestion that might result if the selected circuit is moved to the identified operational circuit site (i.e., the site identified at 2015). When this move entails swapping the physical location of the selected circuit with the physical location of another circuit, the cost of the physical-location reassignment accounts for the movement of the other circuit as well (e.g., accounts for the change in the expected wire length and/or congestion due to the movement of the other circuit).

A sub-cycle reassignment is a reassignment of the selected circuit to a new sub-cycle (i.e., from one operational circuit site that is in one sub-cycle to another operational circuit site that is in another sub-cycle). Some embodiments compute a cost for a new sub-cycle assignment based on a metric that accounts for change in the congestion (e.g., for the increase or decrease in the congestion of all the paths or of one or more paths that include the selected circuit) in the current and potentially future sub-cycle of the selected circuit. When the move entails swapping the sub-cycle assignment of the selected circuit with the sub-cycle assignment of another circuit, the cost of the sub-cycle reassignment accounts for the movement of the other circuit as well (e.g., accounts for the change in the expected sub-cycle congestion due to the movement of the other circuit).

Some embodiments do not expressly account for potential sub-cycle reassignments, and instead only expressly account for potential reassignments in physical location. For instance, when costing a move of the selected circuit between two operational circuit sites that occupy the same physical circuit site in two different sub-cycles, some embodiments do not expressly assign a cost for the change, so long as the move does not create a timing violation.

However, even some of these embodiments implicitly account for potential sub-cycle reassignments. For instance, some embodiments do not allow the selected circuit to be moved to a new sub-cycle when such a move would cause a timing violation in one or more sub-cycles. One example of a timing violation would occur when the assignment of the selected circuit to the new sub-cycle would cause the selected circuit's path to exceed the available time period for operation in the new sub-cycle. For instance, assume that the identified move reassigns the fourth circuit 2205 in the first path 2200 in FIG. 22 from the second sub-cycle to the third sub-cycle, as illustrated in parts (a) and (b) of FIG. 24. Such a move might result in a timing violation as the operation of the fourth, fifth, and sixth circuits 2205–2215 of the path 2200 might exceed the allotted time period for the third sub-cycle (e.g., the signal transit through the fourth, fifth, and sixth circuits might take longer than the X number of picoseconds that represents the time period for the third sub-cycle).

On the other hand, whenever feasible, some embodiments allow a move to a new sub-cycle even when such a move causes a path (e.g., a path containing the selected circuit or containing a circuit that swapped with the selected circuit) to exceed the duration of one or more sub-cycles. In some embodiments, the process 2000 allow such moves if the timing violations can be rectified through "retiming," or can be ameliorated through "operational time extension."

Figure 24:
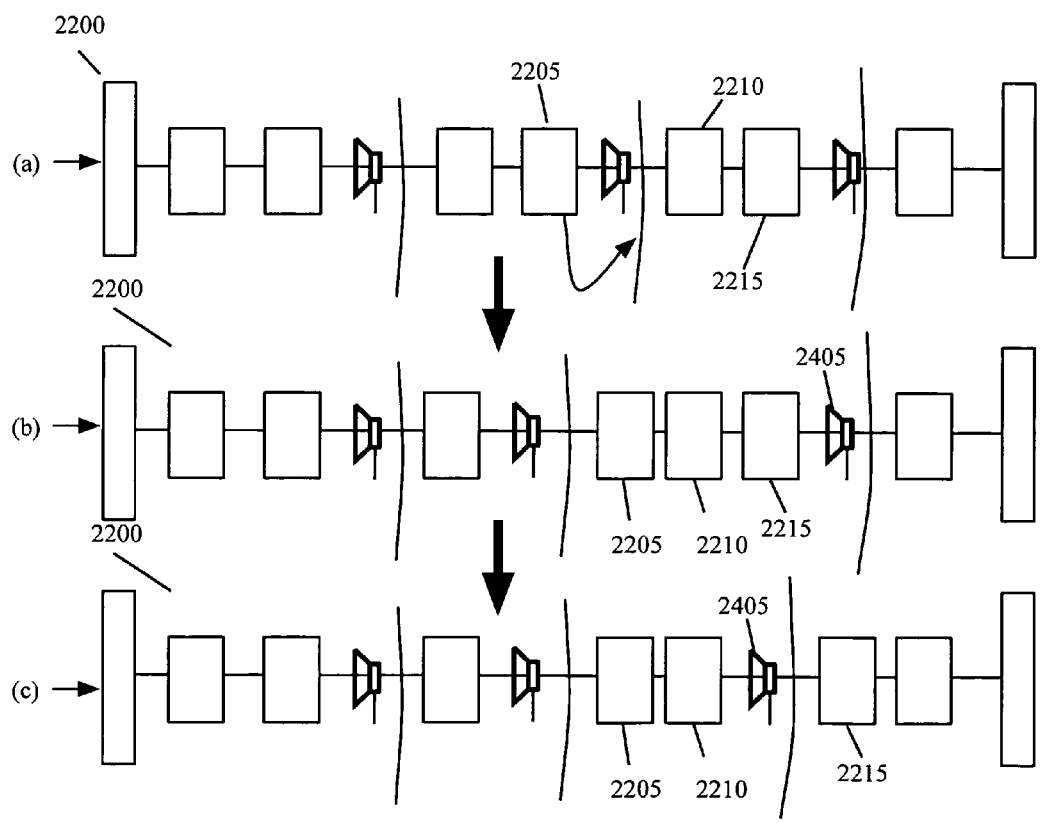
FIG. 24 illustrates a move that reassigns a circuit from one sub-cycle to another sub-cycle.

In certain situations, retiming can rectify a timing violation that occurs when a move causes a path to exceed its duration in one or more sub-cycle. For instance, in some embodiments, retiming assigns one or more circuits from a congested sub-cycle to another sub-cycle to reduce the path's duration in the congested sub-cycle. Part (c) of FIG. 24 illustrates an example of such a retiming. Specifically, this part illustrates the reassignment of the circuit 2215 from the third to the fourth sub-cycle. This retiming reduces the duration of the path 2200 in the third sub-cycle below its assigned sub-cycle duration, and thereby alleviates the over congestion in this path during the third sub-cycle that resulted form the move of the circuit 2205 to the third sub-cycle. As shown in part (c) FIG. 24, the retiming requires the state element 2405 to be placed before the circuit 2215 instead of being placed after this circuit.

It might not always be possible to rectify a timing violation through retiming. In certain situations, the process 2000 can address a timing violation in a sub-cycle through operational time extension, i.e., by allowing the operations of one or more of the circuits to spill over to the previous or subsequent sub-cycles. Such time-extension moves might not always be possible, but whenever such moves are possible, they are penalized in some embodiments in order to bias the optimizer not to make too many of such moves. Accordingly, instead of prohibiting sub-cycle reassignments that result in the operations of the circuits in a path to exceed the duration(s) of one or more sub-cycles, some embodiments allow the optimization process 2000 to consider such reassignments whenever possible but require the process to assess a penalty cost for making such a reassignment. Operational time extension will be further described below in Section V.

It should be noted that timing violations might occur even when the identified move is within the same sub-cycle (i.e., even when the identified move is between two operational circuit sites in the same sub-cycle). For instance, a physical location reassignment of the selected circuit might result in the operations of the circuits in a path to exceed the duration(s) of one or more sub-cycles. Again, some embodiments prohibit such timing violations, while other embodiments allow such timing violations so long as they can be rectified through retiming or operational time extension, which is penalized as mentioned above.

The third issue to consider in performing the computation and determination operations at 2020 is how the determination is made once the cost is computed. How this determination is made is dependent on the type of optimization technique used to perform the operations of the process 2000. For instance, some optimization techniques (e.g., local optimization) only accept moves that improve the computed cost (e.g., only accept moves that have negative delta cost or reduce the overall cost). Other optimization techniques (e.g., simulated annealing) accept moves that increase the computed cost, but accept fewer such worse moves over time.

When the process 2000 determines (at 2020) that the operation circuit site identified at 2015 should be accepted, the process transitions to 2025, where it moves the selected circuit to the newly identified operational circuit site. When the move identified at 2015 entails swapping the physical location and/or sub-cycle assignment of the selected circuit with the physical location and/or sub-cycle assignment of another circuit, the process 2000 swaps the physical location and/or sub-cycle assignments of the two circuits. From 2025, the process transitions to 2030. The process also transitions to 2030, when it determines that the newly identified operational circuit site should not be accepted for the selected circuit.

At 2030, the process determines whether it should stop its iterations. Again, how this determination is made is dependent on the type of optimization technique used to perform the operations of the process 2000. For instance, some embodiments stop the iterations after failing to improve the computed cost by an acceptable threshold after certain number of failed iterations. In some embodiments, the acceptable threshold and number of failed iterations changes over time (i.e., changes with the number of iterations).

If the process determines (at 2030) that it should not stop, it returns to 2010 to select another circuit for moving, and then repeats the subsequent operations 2015–2030 for the newly selected circuit. When the process determines (at 2030) that it should stop the iterations, it ends.

The invention's optimization process was described above by reference to the optimization process 2000, which sets out one particular way of performing the optimization. One of ordinary skill will realize that the optimization process is performed differently in other embodiments of the invention. For instance, instead of selecting one circuit to move each time at 2010, some embodiments select one or more circuits to move at each iteration through 2010. Also, the process 2000 first computes a score based on an identified move and then moves the selected circuit based on the computed score. Other embodiments, however, might first move the selected circuit, then compute a score to assess the move, and then move the selected circuit back to its original operational circuit site after an assessment that the move should not have been made.

IV. Timing Constraints

Figure 25:
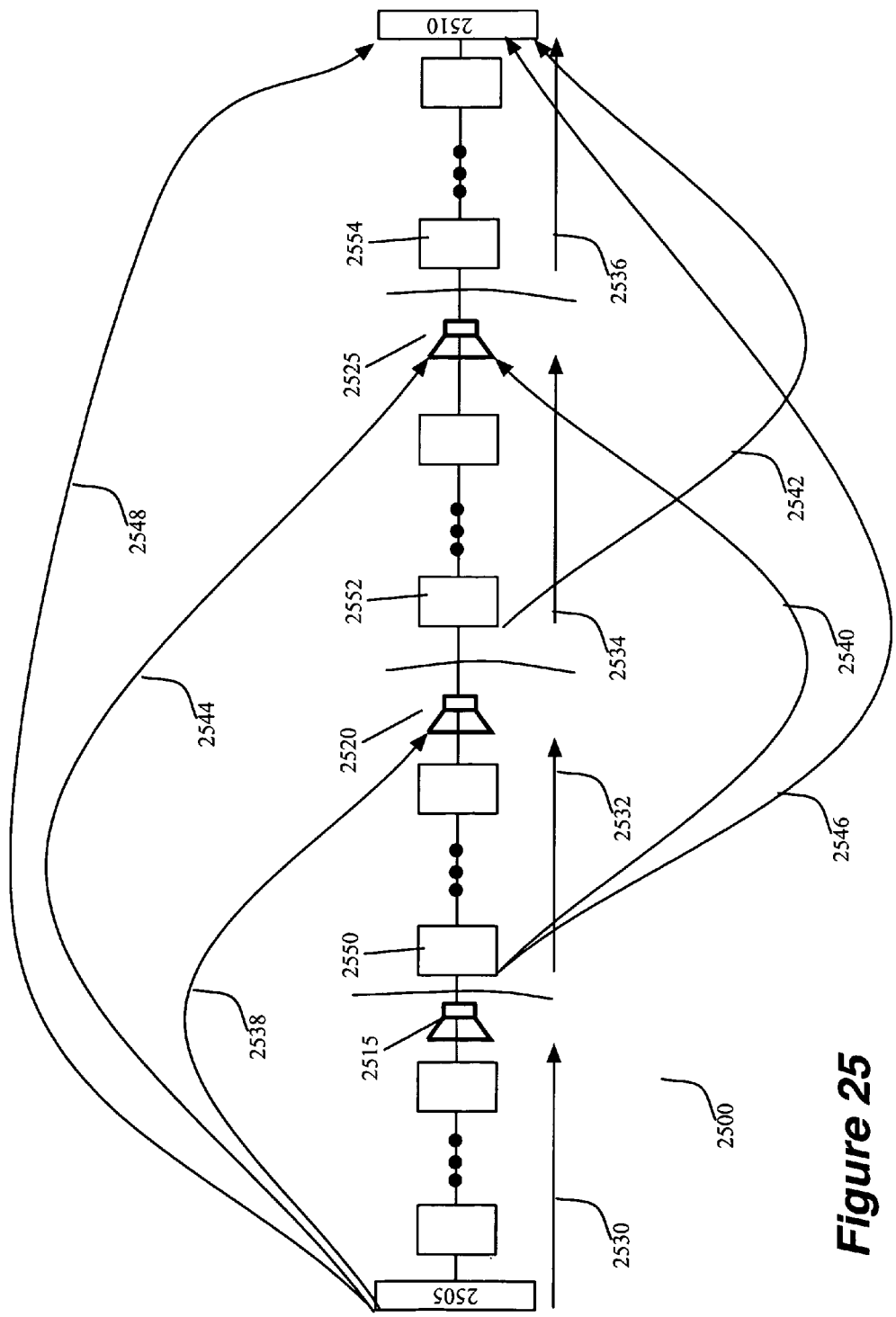
FIG. 25 illustrates how some embodiments define timing constraints that are based on signal delay in a path that is executed in multiple sub-cycles.

FIG. 25 illustrates how some embodiments define timing constraints that are based on signal delay in a path that is executed in multiple sub-cycles. In some embodiments, the optimizer examines these timing constraints for a path each time that it tries to move one or more of the circuits on the path.

FIG. 25 illustrates a path 2500 between two registers 2505 and 2510. This path is implemented in four sub-cycles that are enabled by the three state elements 2515, 2520, and 2525, which maintain the signal at the sub-cycle boundaries. In this example, the three state elements are each an interconnect/storage element 1300 of FIG. 13. This element can operate as an interconnect or as a latch. As such, each element 2515, 2520, or 2525 will be referred to below as a latch.

Each latch 2515, 2520, or 2525 operates in two sub-cycles (e.g., when the latch is an interconnect/storage element, the latch operates as an interconnect element in one sub-cycle and a storage element in another sub-cycle, as mentioned above). However, FIG. 25 illustrates the sub-cycle boundary after the latch because, in this example, the sub-cycles are defined to start at the input of a circuit after a latch. Other embodiments, however, might define the sub-cycle boundary differently.

Ten timing constraints are illustrated in FIG. 25. These ten timing constraints include four single sub-cycle constraints 2530, 2532, 2534, and 2536. They also include six constraints for six contiguously neighboring sets of sub-cycles. These six constraints are (1) three double sub-cycle constraints 2538, 2540, and 2542, (2) two triple sub-cycle constraints 2544 and 2546, and (3) a quadruple sub-cycle constraint 2548.

Each single sub-cycle constraint requires the sub-cycle's duration to be less than the duration allotted to the sub-cycle. As mentioned above, each sub-cycle starts from the first circuit in the sub-cycle, excluding any latch that facilitates the path signal flow during the sub-cycle. Each sub-cycle except the last ends at the start of the latch that facilitates the next sub-cycle, while the last sub-cycle ends at the input of the circuit that is the path's destination.

Similarly, each double, triple, or quadruple sub-cycle constraint requires the duration of the two, three, or four sub-cycles to be less than the duration allotted to the two, three, or four sub-cycles. The start of each two, three, or four sub-cycles is the first circuit in the two, three, or four sub-cycles, excluding any latch that facilitates the path signal flow during the first sub-cycle in the set of sub-cycles. Each sub-cycle set that does not include the last sub-cycle ends at the start of the latch that facilitates the next sub-cycle, while any sub-cycle set that terminates the last sub-cycle ends at the input of the circuit that is the path's destination.

Accordingly, these rules define the following durations for the sub-cycles or the contiguously neighboring sub-cycle sets in FIG. 25:

Duration of sub-cycle 1 is measured (for the timing constraint 2530) from the start of the register 2505 to the input of the latch 2515.

Duration of sub-cycle 2 is measured (for the timing constraint 2532) from the start of the circuit 2550 to the input of the latch 2520.

Duration of sub-cycle 3 is measured (for the timing constraint 2534) from the start of the circuit 2552 to the input of the latch 2525.

Duration of sub-cycle 4 is measured (for the timing constraint 2536) from the start of the register 2554 to the input of the register 2510.

Duration of neighboring sub-cycles 1 and 2 is measured (for the timing constraint 2538) from the start of the register 2505 to the input of the latch 2520.

Duration of neighboring sub-cycles 2 and 3 is measured (for the timing constraint 2540) from the start of the circuit 2550 to the input of the 2525.

Duration of neighboring sub-cycles 3 and 4 is measured (for the timing constraint 2542) from the start of the circuit 2552 to the input of the register 2510.

Duration of neighboring sub-cycles 1, 2, and 3 is measured (for the timing constraint 2544) from the start of the register 2505 to the input of the latch 2525.

Duration of neighboring sub-cycles 2, 3, and 4 is measured (for the timing constraint 2546) from the start of the circuit 2550 to the input of the register 2510.

Duration of neighboring sub-cycles 1, 2, 3, and 4 is measured (for the timing constraint 2548) from the start of the register 2505 to the input of the register 2510.

The path 2500 is legal from a timing point of view when it does not violate any of the ten timing constraints. If the path 2500 cannot meet the timing constraint that is defined over the entire path (i.e., overall-path timing constraint, which in this case is the quadruple sub-cycle constraint 2548), then it cannot be made legal through retiming or operational time extension. When the path meets the overall-path timing constraint 2548 (i.e., when the duration of the neighboring sub-cycles 1, 2, 3, and 4 is less than the sum of the four sub-cycle durations), it might not meet one of the other sub-cycle or sub-cycle set constraints. However, in this situation, it might be possible to make the path legal through retiming, and it will be possible to make the path legal through time extension, as further described below.

The examples above and below discuss optimizing a four sub-cycle design. Other embodiments, however, might include some other number of reconfiguration sub-cycles, like six or eight. Using the guidelines provided above, these embodiments have a different number of signal delay timing constraints. Assuming that a path has at least one circuit in each sub-cycle that needs to be reconfigured in that sub-cycle, the path in a six sub-cycle embodiment would have to satisfy: 1 six sub-cycle constraint, 2 five sub-cycle constraints, 3 four sub-cycle constraints, 4 three sub-cycle constraints, 5 two sub-cycle constraints, and 6 single sub-cycle constraints. Assuming that a path has at least one circuit in each sub-cycle that needs to be reconfigured in that sub-cycle, the path in an eight sub-cycle embodiment would have to satisfy: 1 eight sub-cycle constraints, 2 seven sub-cycle constraints, 3 six sub-cycle constraints, 4 five sub-cycle constraints, 5 four sub-cycle constraints, 6 three sub-cycle constraints, 7 two sub-cycle constraints, and 8 single sub-cycle constraints. In addition, other embodiments might define the signal delay timing constraints differently, or define the sub-cycle or the sub-cycle set durations differently.

V. Operational Time Extension

As mentioned above, some embodiments allow the operation of a circuit that is assigned to one sub-cycle to start or end in another sub-cycle. In other words, these embodiments allow the circuit to time extend in one or more sub-cycles that are before and/or after the circuit's assigned sub-cycle. The optimizer of some embodiments penalizes each move that will cause the duration of the operation of the circuits assigned to one sub-cycle to exceed the sub-cycle's duration. The optimizer penalizes such moves as these moves reduce the overall reconfigurable nature of the reconfigurable IC. They reduce the IC's reconfigurability by having one circuit operate in more than one sub-cycle, which reduces the number of operational circuit sites for the other circuits in the design.

In some embodiments, operational time extension is enabled through the use of state elements that can maintain their states (e.g., can store a value). Such state elements maintain the input of the time-borrowing circuit in the sub-cycle or sub-cycles that the circuit borrows. In the examples described below, this state element is the interconnect/storage element 1300 of FIG. 13. This element can operate as an interconnect or as a latch. As such, this element will be referred to below as a latch.

Figure 26:
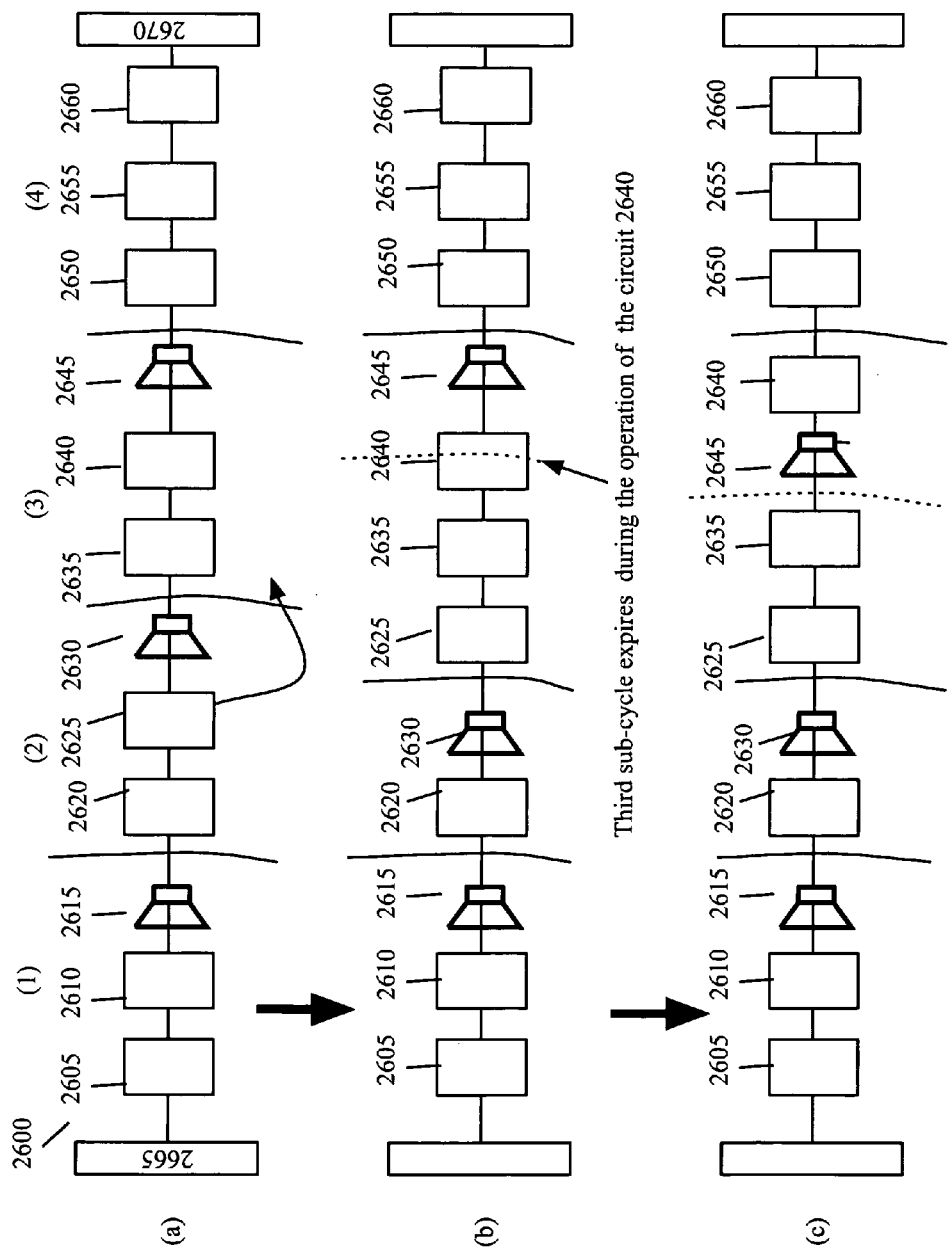
FIG. 26 illustrates operational time extension and the use of state elements to perform operational time extension.
Figure 27:
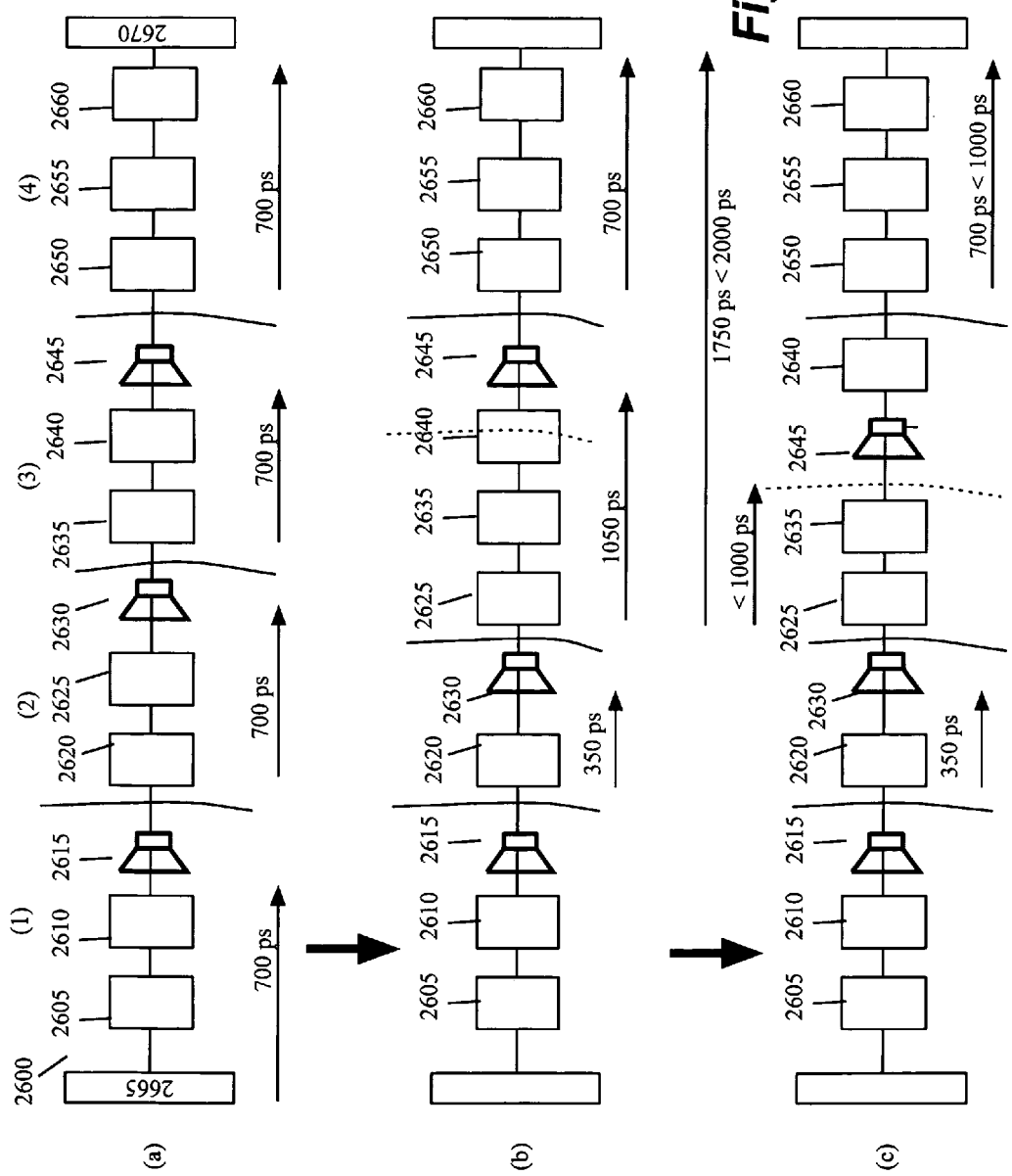
FIG. 27 illustrates two sets of signal-delay values through the path of FIG. 26, where one set of values can be rectified.

FIG. 26 provides an example that illustrates operational time extension and the use of latches to perform operational time extension. Specifically, this figure illustrates a path 2600 between two user registers 2665 and 2670. The path 2600 includes twelve circuits. As shown in part (a) of FIG. 26, the operation of these circuits is initially divided into four sub-cycles, with three circuits in each sub-cycle. As shown in part (a) of FIG. 26, three of the twelve circuits are latches 2615, 2630, and 2645 that are defined at the sub-cycle boundaries. The latches 2615, 2630, and 2645 are defined from the start to extend their operation from one sub-cycle to the next (i.e., to receive data in one sub-cycle and latch and hold the received data in the next sub-cycle).

Parts (a) and (b) of FIG. 26 illustrate reassignment of the circuit 2625 from the second sub-cycle to the third sub-cycle. As shown in part (b) of FIG. 26, this reassignment moves the latch 2630 from the front of the circuit 2625 to back of the circuit 2625. This reassignment also leads to the time period for the third sub-cycle terminating before the operation of the circuit 2640 has been completed.

Accordingly, to solve this short fall, the circuit 2640 is assigned to both the third and fourth sub-cycles, as shown in part (c) of FIG. 26. The latch 2640 is moved from in front of the circuit 2645 to behind the circuit 2645, as this new position is needed to facilitate the transition between the third and fourth sub-cycles. In this position, the interconnect/storage circuit 2645 acts during the third sub-cycle as an interconnect circuit that passes the signal from the circuit 2635 to the circuit 2640, while acting during the fourth sub-cycle as a latch that outputs the value that the interconnect circuit 2645 was outputting during the third sub-cycle. In other words, the interconnect circuit 2645 acts as a storage element in the fourth sub-cycle in order to provide the circuit 2640 with the same input during the third and fourth sub-cycle, so that the circuit 2640 can complete its operation during the fourth sub-cycle along with the circuits 2650, 2655, and 2660.

In the example illustrated in FIG. 26, the circuit 2645 is an interconnect/storage circuit that is moved after the optimizer identifies the move for the circuit 2625. When this interconnect/storage circuit is moved from the front to the back of the circuit 2640, it might be moved from one physical circuit site to another physical circuit site, or it might be at the same physical circuit site but defined to receive the output of the circuit 2635 instead of the output of the circuit 2640.

More generally, after identifying a move, the optimization process 2000 might determine that the move results in the operation of a path violating one or more signal delay timing constraints over one or more sections of the path. The optimization process 2000 then will try to address the timing constraint violation through retiming or time extensions. Both retiming and time extension involve shorting a section of the path that does not meet one or more timing constraint, by moving the latch at the end of the section back in the path. Moving the latch back in the path reduces the length of the section of the path (behind the latch) that does not meet one or more timing constraints. This move, however, expands the duration of the path in front of the latch that is moved back.

Both retiming and time extension require a latch to be moved in the path. In some embodiments, retiming can be performed by moving the latch backwards or forwards in a path, while time extension only allows the latch to be moved back in the path. Another difference between retiming and time extension is that in retiming, the latch commences its storage operation (e.g., its latching operation) at a boundary between two sub-cycles, while in time extension, the latch commences its storage operation (e.g., its latching operation) behind one or more circuits that commence their operations in the earlier of the two sub-cycles.

A retiming move still needs to result in a path that meets all single and multi sub-cycle constraints. A time-extension move also needs to result in a path that meets all applicable single and multi sub-cycle constraints, except that the time extending circuits are not taken into consideration when considering one or more of the constraints. Specifically, when considering a time-extension move of a particular latch that is between a first earlier sub-cycle and a second later sub-cycle, all timing constraints that relate to durations that end with the particular latch have to be met. Also, the time-extension move has to meet all timing constraints that are measured starting at the first circuit after the last time extending circuit (i.e., starting at the first circuit of the second sub-cycle). In addition, the time-extension move has to meet all timing constraints that are measured starting at the first circuit of the first sub-cycle and ending with the latch or register at the end of the second sub-cycle.

In some embodiments, time extensions might result in the elimination of one or more timing constraints, except the overall-path timing constraint. Specifically, when considering a time-extension move of a first latch that is between a first earlier sub-cycle and a second later sub-cycle, one possible move would be to move the latch behind all of the circuits that are to operate in an first earlier sub-cycle. When the optimization process 2000 is left with only such a move, the process considers eliminating the latch between the earlier and later sub-cycles and having all the circuits in the earlier sub-cycle time extend into (i.e., also operate in) the later sub-cycle. This time extension possibility would rely on a second latch that is between the first earlier sub-cycle and a third sub-cycle that is before the first earlier sub-cycle. This time extension possibility effectively eliminates the timing constraints that were defined with respect to the eliminated latch. Also, if this time extension does not lead to a path that meets the timing constraints, the process 2000 can explore moving the second latch back in the third sub-cycle.

Alternatively, when a time extension operation results in a first latch being moved backward to abut a second prior latch in a particular path, some embodiments do not eliminate the first latch or the timing constraints that were defined by reference to the first latch. These embodiments maintain such a first latch to simplify the timing analysis of the particular path during any move of this path's circuits, which might later be identified by the optimizer. Also, the timing constraints that are defined by reference to the first latch remain after the move that abuts the first and second latch, although these timing constraints would mostly be perfunctory as there is no duration or little duration defined between the two latches, in some embodiments.

Figure 28:
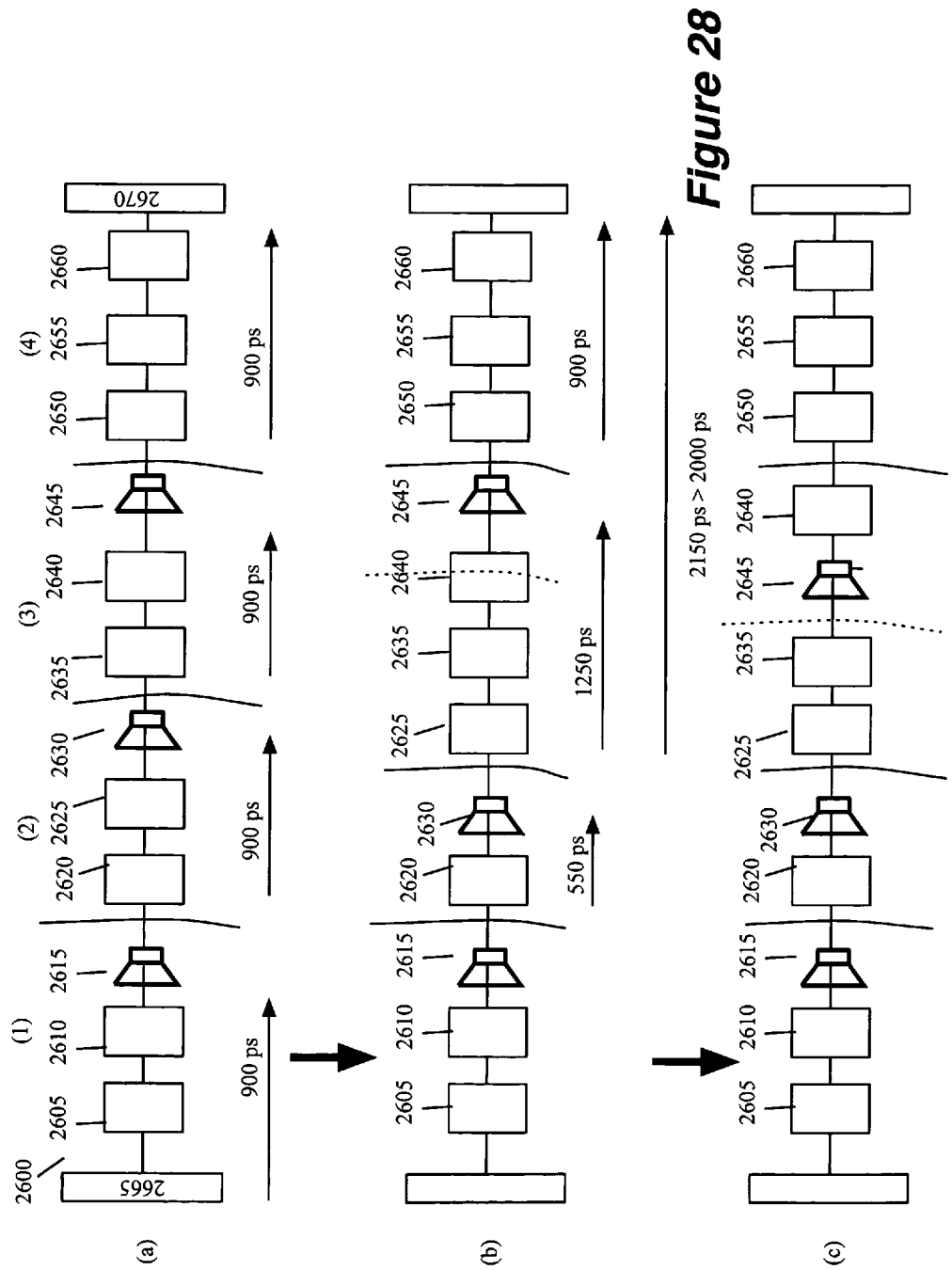
FIG. 28 illustrates two sets of signal-delay values through the path of FIG. 26, where one set of values cannot be rectified.
Figure 37:
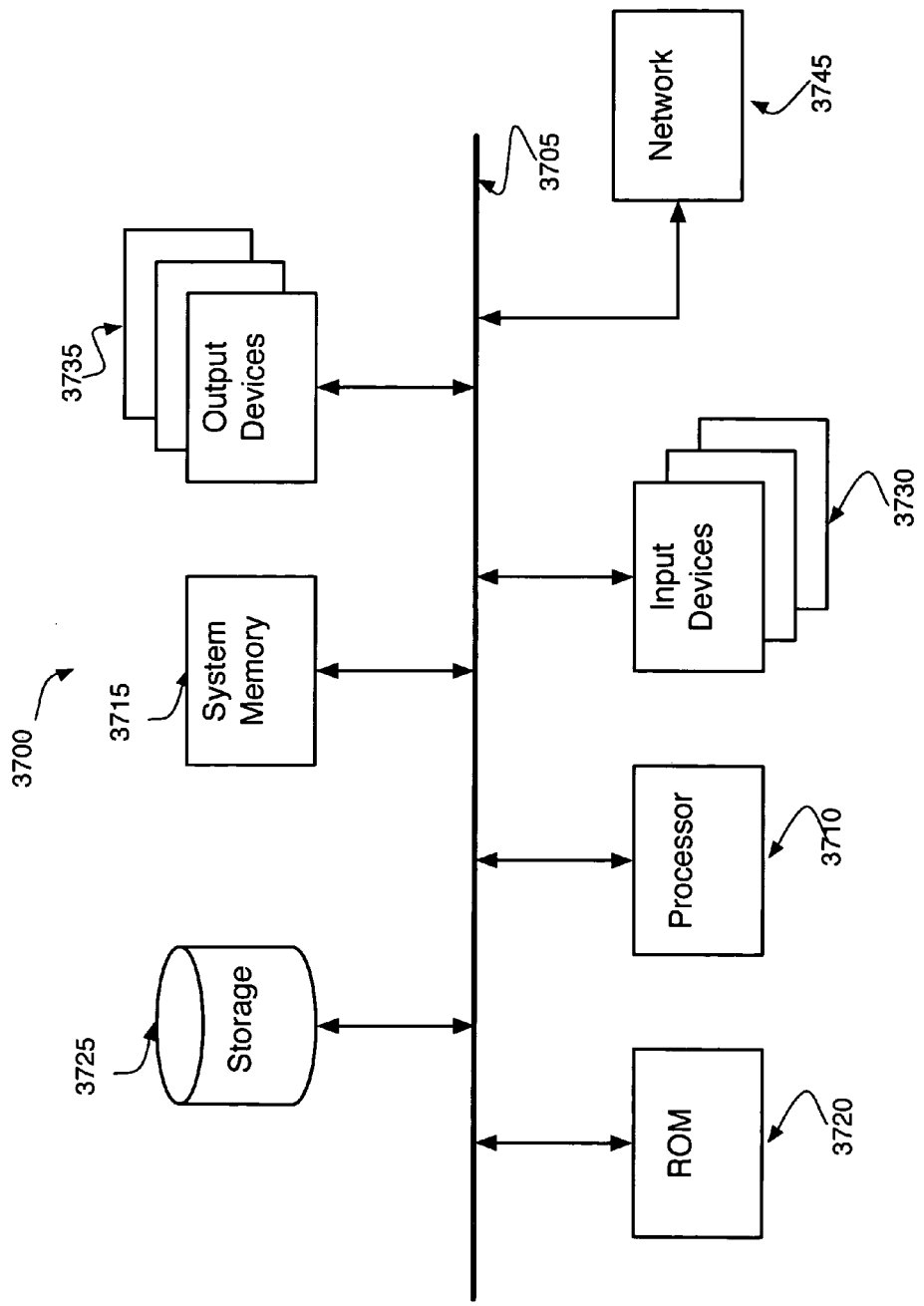
FIG. 37 presents a computer system with one embodiment of the invention is implemented.

Timing extension and retiming will now be further described by providing different signal delay values for the path 2600 of FIG. 26. In the previous discussion of this example, it was assumed that time extending the operation of the circuit 2640 to the fourth sub-cycle allows the signal to pass through the path 2600 within the allotted time. However, in certain situations, this might not be the case. To illustrate this, FIGS. 37 and 28 present two sets of signal-delay values through the path 2600 of FIG. 26. One set of values (the ones provided in FIG. 37) can be rectified through time extending the operation of the circuit 2640, while the other set of values (the ones provided in FIG. 28) cannot. In both these examples, it is assumed that the signal has to pass through the path 2600 in 4000 picoseconds (ps), and that each sub-cycle is 1000 ps long.

In the example illustrated in FIG. 37, the actual duration of operation of the circuits in each sub-cycle before the move is 700 ps, as shown in part (a) of this figure. Given this operational duration, FIG. 37 illustrates an example where the timing violation caused by the reassignment of the circuit 2625 (to the third sub-cycle) can be alleviated through operational time extension. Specifically, part (b) of FIG. 37 illustrates that the duration of the third sub-cycle is 1050 ps after the assignment of the circuit 2625 to this sub-cycle. However, part (c) of FIG. 37 illustrates that allowing the circuit 2640 to time extend into the fourth sub-cycle, leads to a signal flow that meets all three constraints that are at issue at the boundary of the third and fourth sub-cycles. Specifically, time extending the operation of the circuit 2640 results in:

1. a combined signal path delay of 1750 ps from the input of circuit 2625 to the input of the user register 2670 (i.e., a duration of 1750 ps for the circuits operating in the third and fourth sub-cycles), which does not exceed the 2000 ps allotted for the third and fourth sub-cycles;
2. a signal path delay that does not exceed 1000 ps from the input of the circuit 2625 to the input of the latch 2645 (i.e., a duration that does not exceed 1000 ps for the operations of the circuits in the third sub-cycle before the latch 2645);
3. a signal path delay that does not exceed 1000 ps from the input of the circuit 2650 (which is the first circuit after the last time extending circuit 2640) to the input of the user register 2670.

In the example illustrated in FIG. 28, the actual duration of operation of the circuits in each sub-cycle before the move is 900 ps, as shown in part (a) of this figure. Given this operational duration, FIG. 28 illustrates an example where the timing violation caused by the reassignment of the circuit 2625 (to the third sub-cycle) is not alleviated through one operational time extension. Specifically, part (b) of FIG. 28 illustrates that the duration of the third sub-cycle is 950 ps after the assignment of the circuit 2625 to this sub-cycle. Moreover, part (c) of FIG. 28 illustrates that even with the circuit 2640 time extending into the fourth sub-cycle, the combined duration of the third and fourth sub-cycles is 2150 ps, which is more than the available 2000 ps for these two sub-cycles. However, this situation might be alleviated through other time extension (e.g., potentially moving latch 2630 behind 2620, which would result in time extending across more than one sub-cycle).

Figure 29:
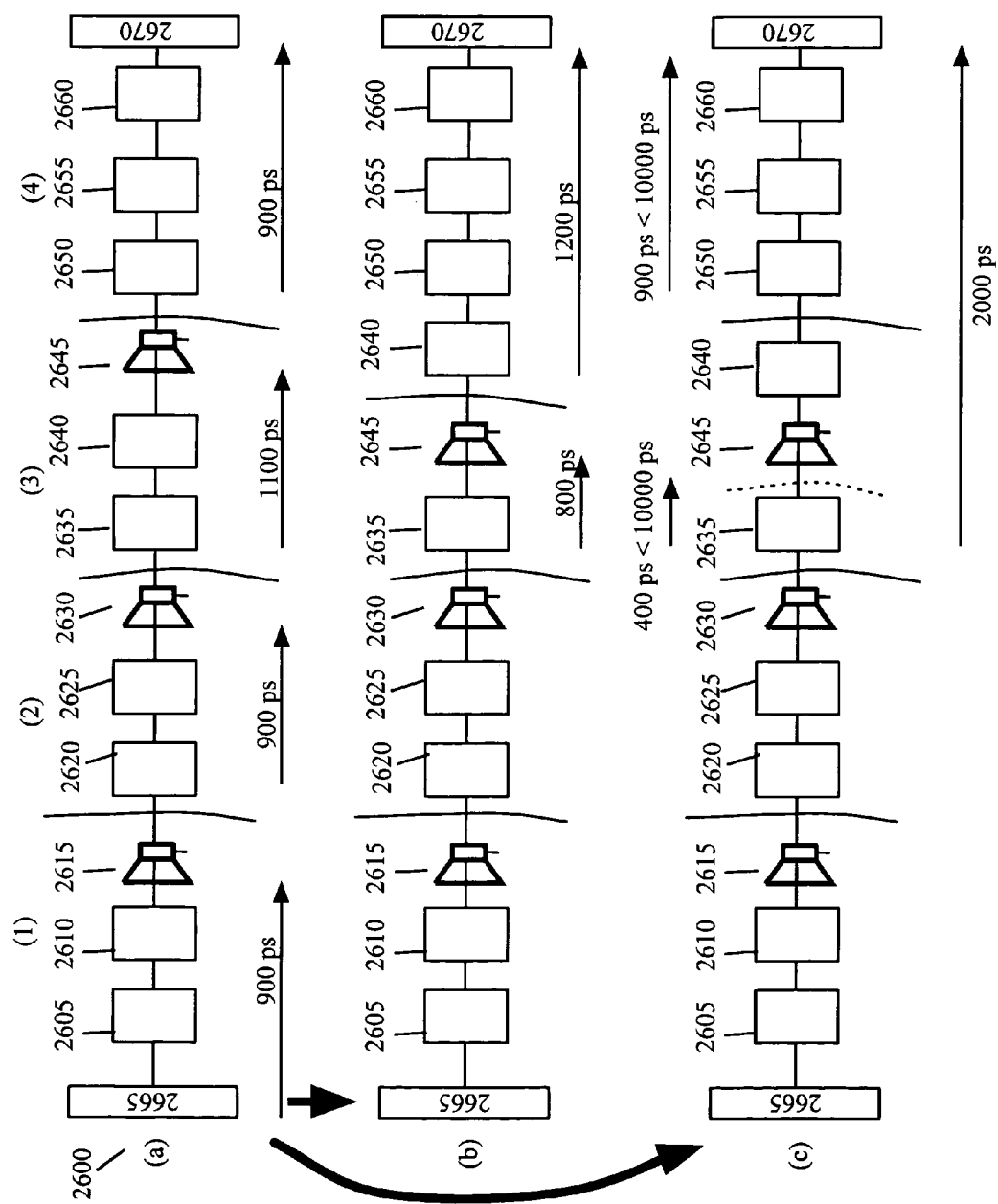
FIG. 29 illustrates another set of numerical values for the durations of the operations of the circuits in the example illustrated in FIG. 26.

Time extensions are useful in addressing time violations that cannot be fixed through retiming. To illustrate this, FIG. 29 presents another set of numerical values for the durations of the operations of the circuits in the example illustrated in FIG. 26. Part (a) of FIG. 29 illustrates that the duration of the operation of the circuits in the first, second and fourth sub-cycles are 900 ps each, while the duration of the operation of the circuits in the third sub-cycle is 1100 ps, which exceeds the 1000 ps allotment. In other words, part (a) shows that the path initially has a timing violation in sub-cycle 3.

Part (b) of this figure illustrates that this timing violation cannot be cured through retiming. Specifically, it illustrates that moving the operation of the circuit 2640 to the fourth sub-cycle creates a timing violation in the fourth sub-cycle (i.e., it causes the duration of the operation of the circuits in the fourth sub-cycle to be 900 ps, which exceeds the 1000 ps allotment).

However, the timing violation illustrated in part (a) of FIG. 29 can be addressed through time extending the operation of the circuit 2640 into the fourth sub-cycle, as shown in part (c) of this figure. This time extension is achieved by moving the circuit 2645 behind the circuit 2640. This move creates a path that meets the constraints mentioned above. Specifically, it results in:

1. a combined signal path delay of 2000 ps from the input of the circuit 2635 to the input of the user register 2670 (i.e., a duration of 2000 ps for the circuits operating in the third and fourth sub-cycles), which does not exceed the 2000 ps allotted for the third and fourth sub-cycles;
2. a signal path delay of 400 ps from the input of the circuit 2635 to the input of the latch 2645 (i.e., a duration of 400 ps for the operations of the circuits in the third sub-cycle before the latch 2645);
3. a signal path delay of 900 ps from the input of the circuit 2650 (which is the first circuit after the last time extending circuit 2640) to the input of the user register 2670.

In the description above, the latch (e.g., latch 2645) that facilitates the time extension can be viewed as one of the time extending circuits. Whether the latch is one of the time extending circuits is an issue of nomenclature in the cases where the latch is moved from a sub-cycle boundary to a position behind the maintained circuits that are time extended. This is because in this situation the latch (e.g., latch 2645) would have operated in the third and fourth sub-cycles even had it not been moved from the boundary of these two sub-cycles.

Although time extension was described above by reference to numerous details, one of ordinary skill will realize that other embodiments might perform time extensions differently. For instance, as mentioned above, some embodiments perform the optimization process 2000 as part of a routing operation that defines interconnect circuits (i.e., a routing circuit) for connecting the various circuits of a path that was placed previously to the routing operation or is being concurrently placed with the routing operation. In such embodiments, the process can facilitate time extensions by moving a latch from a sub-cycle boundary to the back of the maintained circuit(s).

Alternatively, if one of the circuits behind the maintained circuit(s) is an interconnect circuit, the process can also use this interconnect circuit as the latch that facilitates the time extension when this circuit is an interconnect/storage circuit. When this interconnect circuit is not an interconnect/storage circuit, the process can also replace this interconnect circuit with an interconnect/storage circuit that serves as a latch that facilitates the time extension. In these embodiments, whether the optimization process supports the time extension by moving a latch from a sub-cycle boundary or utilizing an interconnect/storage circuit before maintained circuit(s) depends on one or more factors, such as (1) the proximity of the interconnect/storage circuit from the maintained circuit(s), (2) the delay due to an extra latch that might be avoided by reusing an available interconnect/storage circuit, etc.

VI. Reconfigurable Architectures

Figure 30:
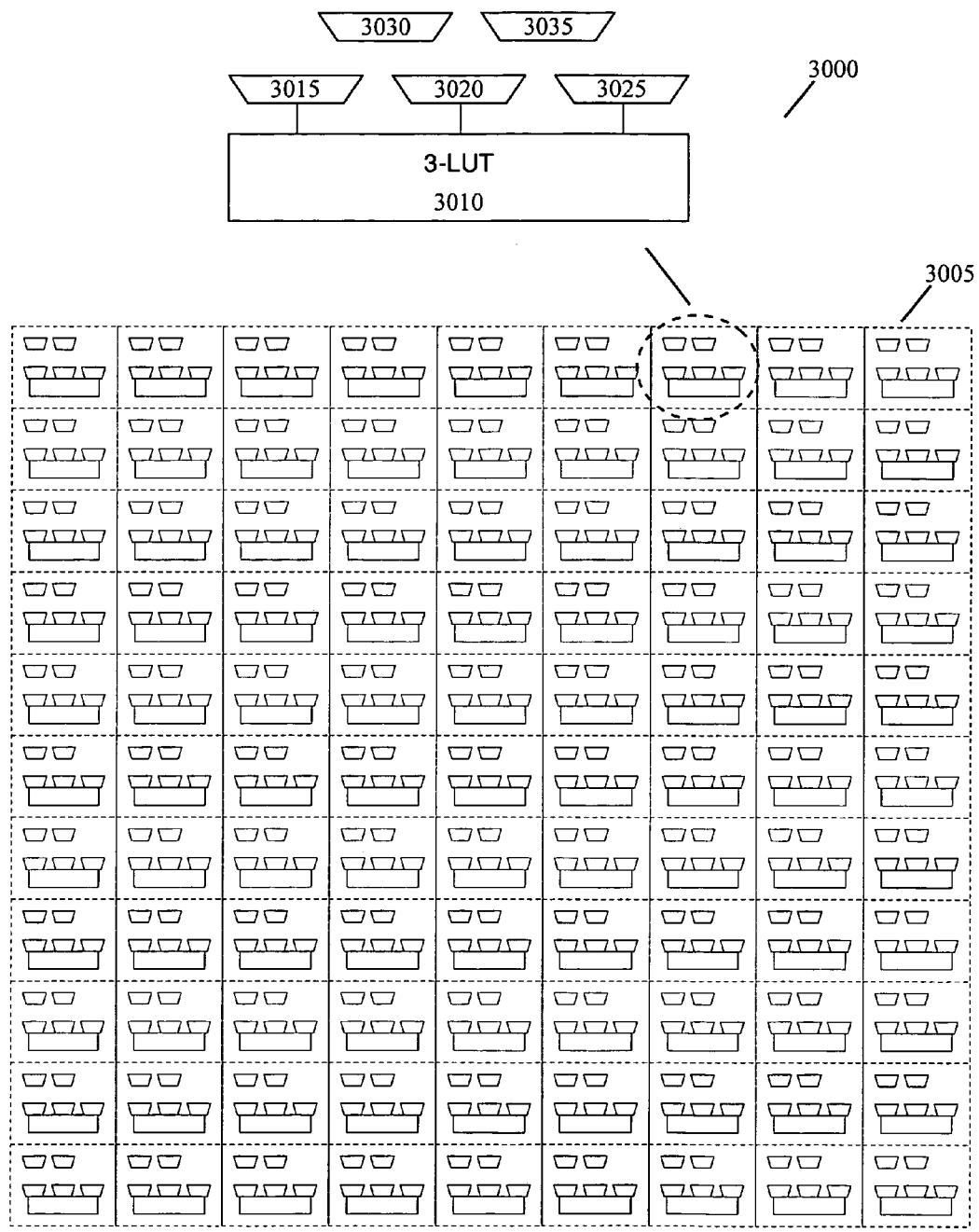
FIG. 30 illustrates an example of a configurable tile arrangement architecture that is formed by numerous configurable tiles that are arranged in an arrangement with multiple rows and columns.
Figure 31:
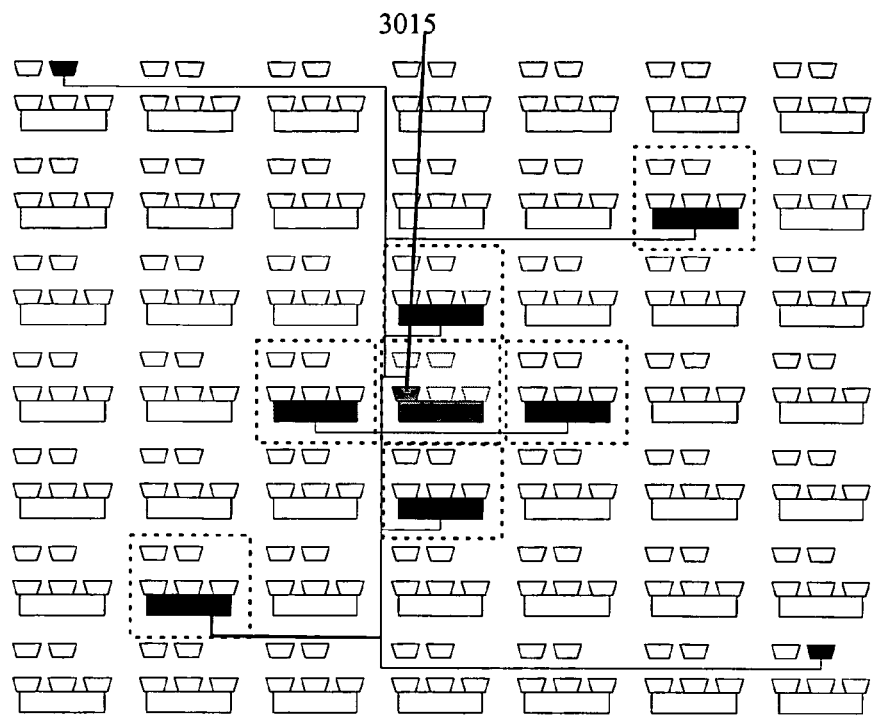
FIG. 31 illustrates an example of a configurable tile arrangement architecture that is used in some embodiments of the invention.
Figure 32:
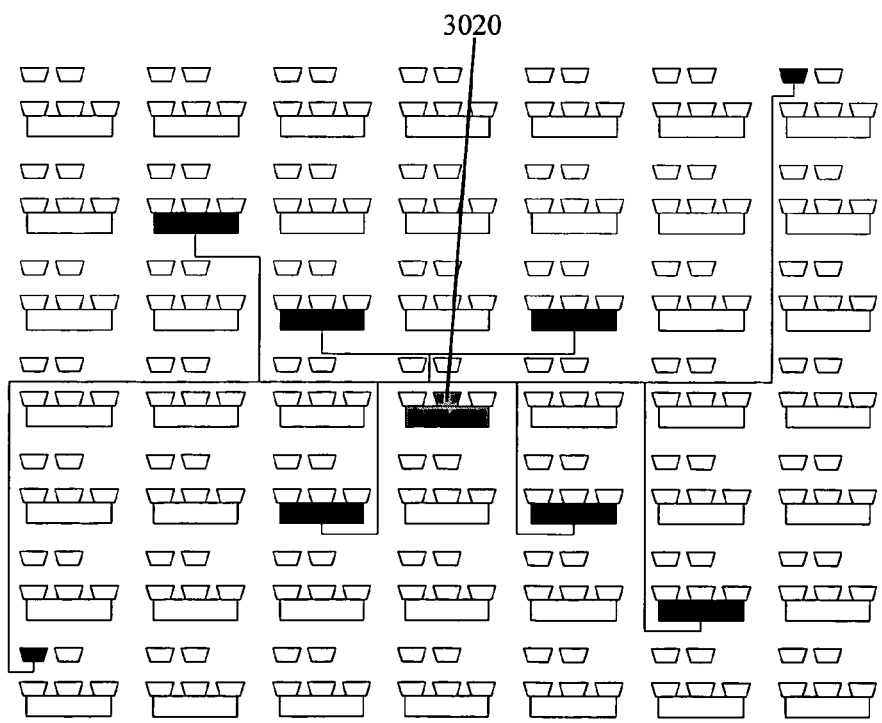
FIG. 32 illustrates an example of a configurable tile arrangement architecture that is used in some embodiments of the invention.
Figure 33:
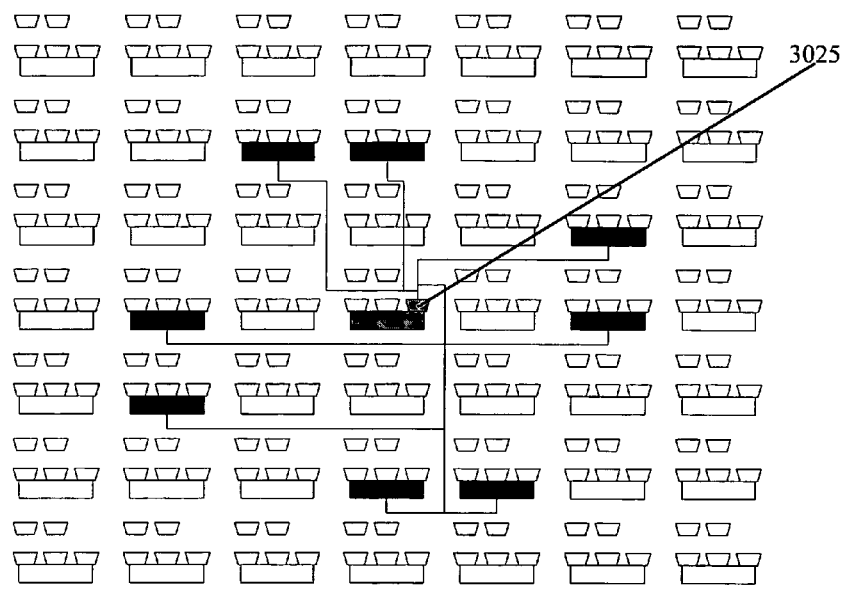
FIG. 33 illustrates an example of a configurable tile arrangement architecture that is used in some embodiments of the invention.
Figure 34:
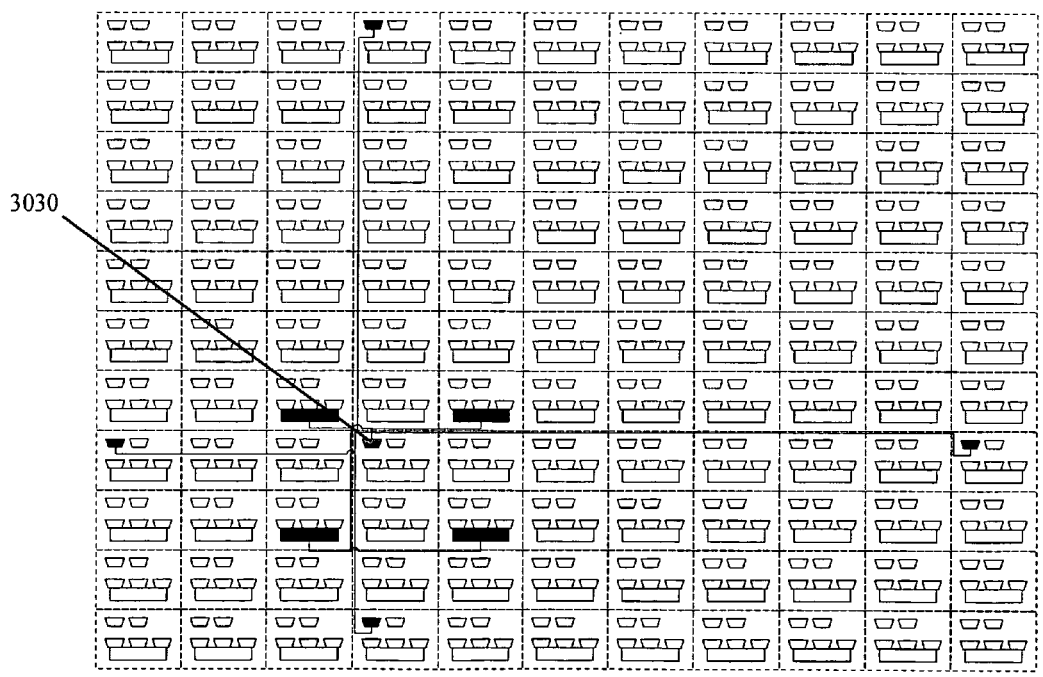
FIG. 34 illustrates an example of a configurable tile arrangement architecture that is used in some embodiments of the invention.
Figure 35:
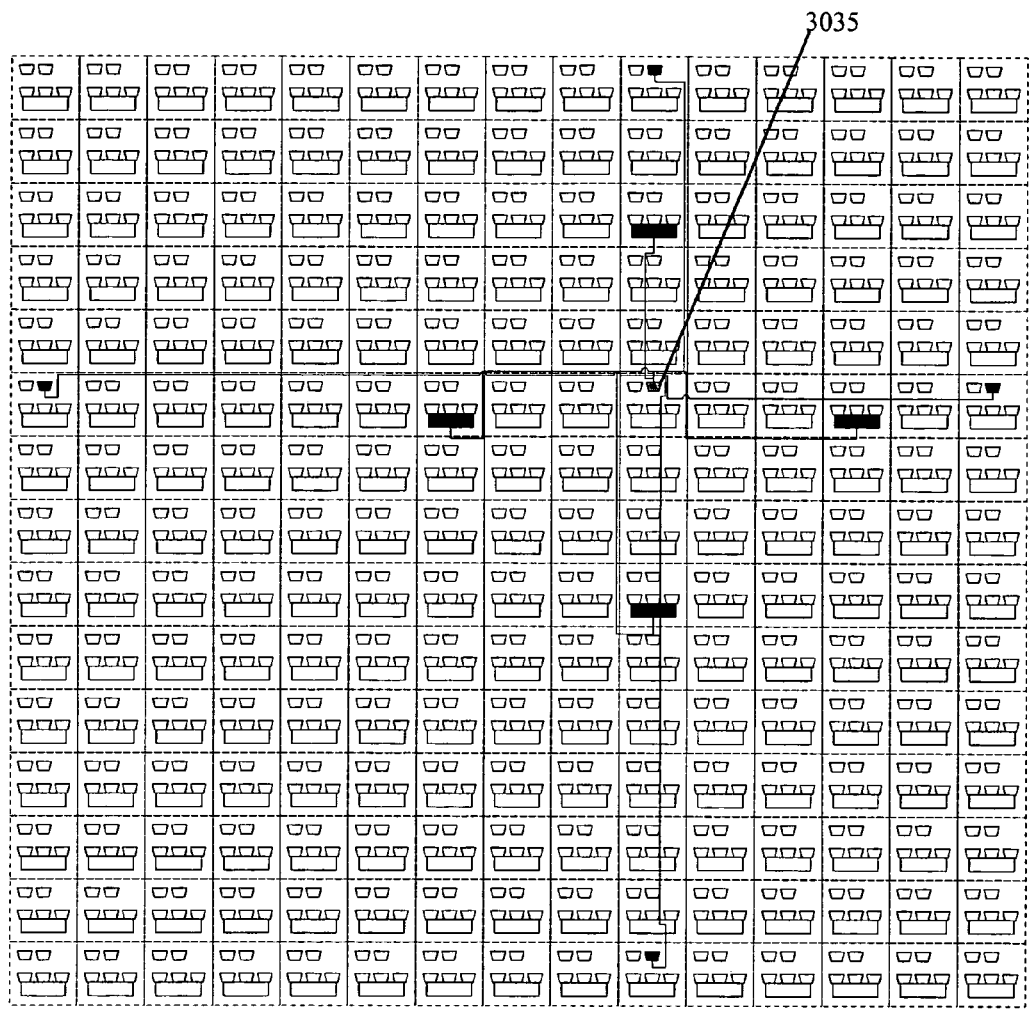
FIG. 35 illustrates an example of a configurable tile arrangement architecture that is used in some embodiments of the invention.

FIGS. 30–35 illustrate an example of a configurable tile arrangement architecture that is used in some embodiments of the invention. As shown in FIG. 30, this architecture is formed by numerous configurable tiles 3005 that are arranged in an array with multiple rows and columns. In FIGS. 30–35, each configurable tile includes a sub-cycle reconfigurable three-input look up table (LUT) 3010, three sub-cycle reconfigurable input-select multiplexers 3015, 3020, and 3025, and two sub-cycle reconfigurable routing multiplexers 3030 and 3035. Other configurable tiles can include other types of circuits, such as memory arrays instead of logic circuits.

In FIGS. 30–35, an input-select multiplexer is an interconnect circuit associated with the LUT 3010 that is in the same tile as the input select multiplexer. One such input select multiplexer receives several input signals for its associated LUT and passes one of these input signals to its associated LUT.

In FIGS. 30–35, a routing multiplexer is an interconnect circuit that at a macro level connects other logic and/or interconnect circuits. In other words, unlike an input select multiplexer in these figures that only provides its output to a single logic circuit (i.e., that only has a fan out of one), a routing multiplexer in some embodiments either provides its output to several logic and/or interconnect circuits (i.e., has a fan out greater than one), or provides its output to other interconnect circuits.

FIGS. 31–35 illustrate the connection scheme used to connect the multiplexers of one tile with the LUT's and multiplexers of other tiles. This connection scheme is further described in U.S. application entitled "Configurable IC with Routing Circuits with Offset Connections", filed concurrently with this application with the Ser. No. 11/082,193. This application is incorporated herein by reference.

In the architecture illustrated in FIGS. 30–35, each tile includes one three-input LUT, three input-select multiplexers, and two routing multiplexers. Other embodiments, however, might have a different number of LUT's in each tile, a different number of inputs for each LUT, a different number of input-select multiplexers, and/or a different number of routing multiplexers. For instance, some embodiments might employ an architecture that has in each tile: one three-input LUT, three input-select multiplexers, and eight routing multiplexers. Several such architectures are further described in the above-incorporated patent application.

Figure 36:
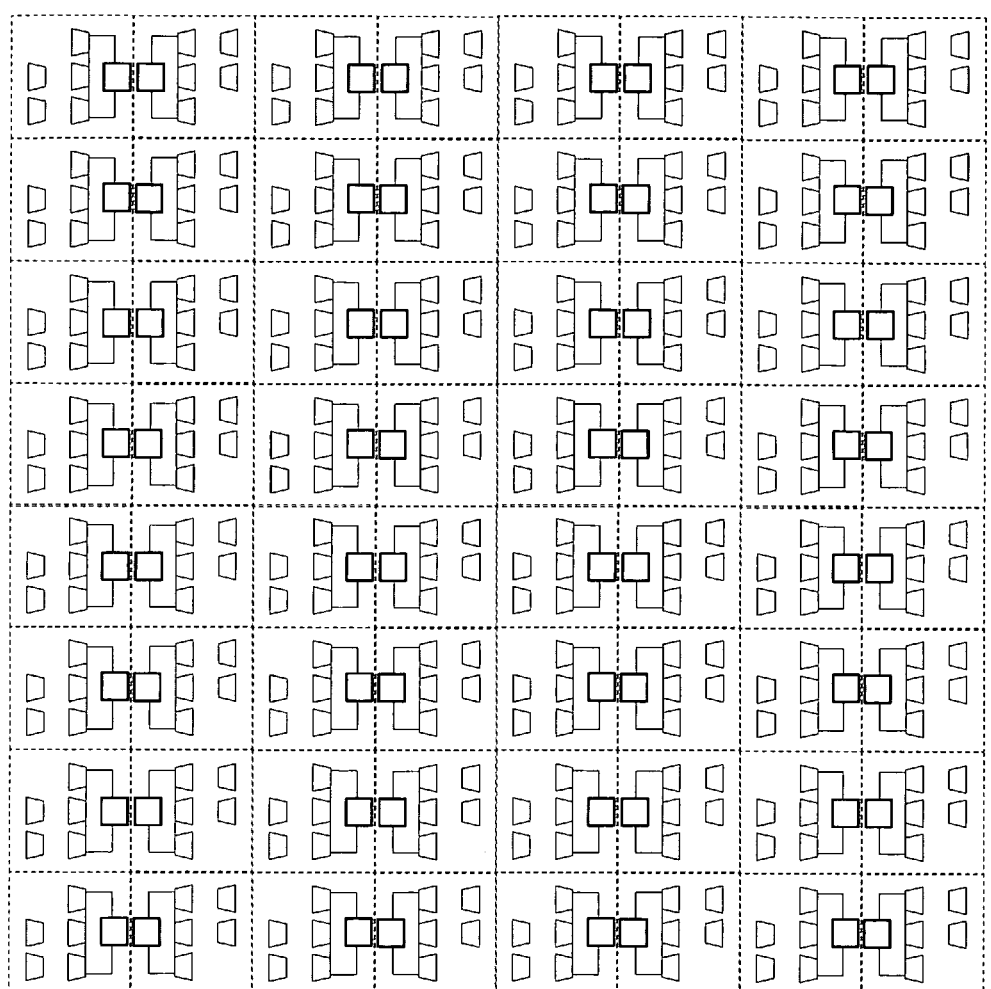
FIG. 36 illustrates a possible physical architecture of the configurable IC illustrated in FIG. 30.

In some embodiments, the examples illustrated in FIGS. 30–35 represent the actual physical architecture of a configurable IC. However, in other embodiments, the examples illustrated in FIGS. 30–35 topologically illustrate the architecture of a configurable IC (i.e., they show connections between circuits in the configurable IC, without specifying (1) a particular geometric layout for the wire segments that establish the connection, or even (2) a particular position of the circuits). In some embodiments, the position and orientation of the circuits in the actual physical architecture of a configurable IC is different than the position and orientation of the circuits in the topological architecture of the configurable IC. Accordingly, in these embodiments, the IC's physical architecture appears quite different than its topological architecture. For example, FIG. 36 provides one possible physical architecture of the configurable IC 3000 illustrated in FIG. 30. This and other architectures are further described in the above-incorporated patent application.

VII. Computer System

FIG. 37 presents a computer system with which one embodiment of the invention is implemented. Computer system 3700 includes a bus 3705, a processor 3710, a system memory 3715, a read-only memory 3720, a permanent storage device 3725, input devices 3730, and output devices 3735. The bus 3705 collectively represents all system, peripheral, and chipset buses that communicatively connect the numerous internal devices of the computer system 3700. For instance, the bus 3705 communicatively connects the processor 3710 with the read-only memory 3720, the system memory 3715, and the permanent storage device 3725.

From these various memory units, the processor 3710 retrieves instructions to execute and data to process in order to execute the processes of the invention. The read-only-memory (ROM) 3720 stores static data and instructions that are needed by the processor 3710 and other modules of the computer system.

The permanent storage device 3725, on the other hand, is a read-and-write memory device. This device is a non-volatile memory unit that stores instructions and data even when the computer system 3700 is off. Some embodiments of the invention use a mass-storage device (such as a magnetic or optical disk and its corresponding disk drive) as the permanent storage device 3725.

Other embodiments use a removable storage device (such as a floppy disk or zips disk, and its corresponding disk drive) as the permanent storage device. Like the permanent storage device 3725, the system memory 3715 is a read-and-write memory device. However, unlike storage device 3725, the system memory is a volatile read-and-write memory, such as a random access memory. The system memory stores some of the instructions and data that the processor needs at runtime. In some embodiments, the invention's processes are stored in the system memory 3715, the permanent storage device 3725, and/or the read-only memory 3720.

The bus 3705 also connects to the input and output devices 3730 and 3735. The input devices enable the user to communicate information and select commands to the computer system. The input devices 3730 include alphanumeric keyboards and cursor-controllers. The output devices 3735 display images generated by the computer system. The output devices include printers and display devices, such as cathode ray tubes (CRT) or liquid crystal displays (LCD).

Finally, as shown in FIG. 37, bus 3705 also couples computer 3700 to a network 3745 through a network adapter (not shown). In this manner, the computer can be a part of a network of computers (such as a local area network ("LAN"), a wide area network ("WAN"), or an Intranet) or a network of networks (such as the Internet). Any or all of the components of computer system 3700 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, several embodiments were described above that simultaneously optimize the physical design and sub-cycle assignment of a sub-cycle reconfigurable IC. One of ordinary skill will realize that other embodiments are not to be used for optimizing sub-cycle reconfigurable IC's. For instance, some embodiments are used to optimize simultaneously the physical design and reconfiguration cycle of a reconfigurable IC that does not reconfigure at a sub-cycle basis (i.e., reconfigures at a rate slower than a sub-cycle rate). Thus, one of ordinary skill in the art would understand that the invention is not to be limited by the foregoing illustrative details, but rather is to be defined by the appended claims.

We claim:

1. A reconfigurable integrated circuit ("IC") comprising:
    a) a plurality of reconfigurable circuits, each reconfigurable circuit having a plurality of configurations for a plurality of configuration cycles;
    b) said reconfigurable circuits including a plurality of time-extending reconfigurable circuits, each particular time-extending reconfigurable circuit for maintaining a configuration over at least two contiguous cycles in order to allow a signal to propagate through a signal path, containing the particular time-extending circuit, within a desired amount of time.

2. The reconfigurable IC of claim 1, wherein each reconfigurable circuit receives a plurality of configuration data sets, wherein each configuration data set configures the reconfigurable circuit in a particular manner.

3. The reconfigurable IC of claim 1, wherein during the two contiguous cycles, the particular time-extending reconfigurable circuit receives the same configuration data.

4. The reconfigurable IC of claim 1 further comprising:
    a state element for maintaining an input signal that a particular time-extending circuit receives in the two contiguous cycles constant.

5. The reconfigurable IC of claim 4, wherein the state element is not a transition-sensitive storage element.

6. The reconfigurable IC of claim 4, wherein the state element is a level sensitive storage element.

7. The reconfigurable IC of claim 6, wherein the state element is a latch.

8. The reconfigurable IC of claim 1, wherein at least one time-extending reconfigurable circuit is for maintaining its configuration for more than two configuration cycles.

9. The reconfigurable IC of claim 1, wherein at least one time-extending reconfigurable circuit is on at least another signal path than the signal path that contains the time-extending reconfigurable circuit during the two reconfiguration cycles during which the time-extending circuit does not change configuration.

10. A electronic device comprising:
    a reconfigurable integrated circuit ("IC") comprising:
        a plurality of reconfigurable circuits, each reconfigurable circuit having a plurality of configurations for a plurality of configuration cycles;
        said reconfigurable circuits including a plurality of time-extending reconfigurable circuits, each particular time-extending reconfigurable circuit for maintaining a configuration over at least two contiguous cycles in order to allow a signal to propagate through a signal path, containing the particular time-extending circuit, within a desired amount of time.

11. A method of designing a reconfigurable integrated circuit ("IC") that has a plurality of reconfigurable circuits having a plurality of configurations and operating in a plurality of reconfiguration cycles, the method:
   a) identifying a signal path through the IC that does not meet a timing constraint, said signal path having a plurality of circuits including at least a particular reconfigurable circuit;
   b) maintaining a configuration of the particular reconfigurable circuit constant over at least two contiguous reconfiguration cycles in order to reduce signal delay through the signal path and thereby satisfy the timing constraint.

12. The method of claim 11, wherein identifying the signal path comprises:
   a) identifying changes to the reconfiguration cycle that the reconfiguration circuits are assigned;
   b) after one of the identified changes, identifying the signal path for failing to meet the timing constraint.

13. The method of claim 11, wherein during the two contiguous cycles, the particular reconfigurable circuit receives the same configuration data.

14. The method of claim 11 further comprising:
   defining a state element before the particular reconfigurable circuit, said state element for maintaining an input signal that the particular reconfigurable circuit is to receive during the two contiguous cycles constant.

15. The method of claim 14, wherein the state element is not a transition-sensitive storage element.

16. The method of claim 14, wherein the state element is a level sensitive storage element.

17. The method of claim 16, wherein the state element is a latch.

18. The method of claim 11, said maintaining comprises maintaining the configuration of the particular reconfigurable circuit constant for more than two configuration cycles.

* * * * *

UNITED STATES PATENT AND TRADEMARK OFFICE
CERTIFICATE OF CORRECTION

| | |
|---|---|
| PATENT NO. | : 7,236,009 B1 |
| APPLICATION NO. | : 11/082200 |
| DATED | : June 26, 2007 |
| INVENTOR(S) | : Andre Rohe et al. |

Page 1 of 1

It is certified that error appears in the above-identified patent and that said Letters Patent is hereby corrected as shown below:

<u>Column 2</u>

Lines 37-40 (summary) reads "The method identifies a signal path through the IC that does not meet a timing constraint the signal path includes several circuits, one of which is a particular reconfigurable circuit."

should read (correction of summary) -- The method identifies a signal path through the IC that does not meet a timing constraint. The signal path includes several circuits, one of which is a particular reconfigurable circuit. --

Signed and Sealed this

Third Day of June, 2008

JON W. DUDAS
*Director of the United States Patent and Trademark Office*